(12) United States Patent
Lu et al.

(10) Patent No.: US 11,651,800 B2
(45) Date of Patent: May 16, 2023

(54) SENSE AMPLIFIER MAPPING AND CONTROL SCHEME FOR NON-VOLATILE MEMORY

(71) Applicant: SANDISK TECHNOLOGIES LLC, Addison, TX (US)

(72) Inventors: Feng Lu, Fremont, CA (US); Jongyeon Kim, Milpitas, CA (US); Ohwon Kwon, Pleasanton, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 45 days.

(21) Appl. No.: 17/354,613

(22) Filed: Jun. 22, 2021

(65) Prior Publication Data
US 2022/0406342 A1   Dec. 22, 2022

(51) Int. Cl.
G11C 7/06 (2006.01)
G11C 7/10 (2006.01)

(52) U.S. Cl.
CPC .............. G11C 7/065 (2013.01); G11C 7/106 (2013.01); G11C 7/1048 (2013.01); G11C 7/1063 (2013.01); G11C 7/1087 (2013.01)

(58) Field of Classification Search
CPC .................................. G11C 7/065; G11C 7/06
USPC .................................................... 365/185.21
See application file for complete search history.

(56) References Cited

U.S. PATENT DOCUMENTS

| | | | |
|---|---|---|---|
| 7,577,037 B2 * | 8/2009 | Li | G11C 16/26 365/185.03 |
| 9,001,582 B2 | 4/2015 | Fujimura et al. | |
| 9,472,296 B2 | 10/2016 | Maejima | |
| 9,852,078 B2 | 12/2017 | Zaitsu et al. | |
| 10,811,082 B1 * | 10/2020 | Li | G11C 11/409 |
| 10,825,526 B1 * | 11/2020 | Li | G11C 16/24 |
| 2012/0113716 A1 * | 5/2012 | Liu | G11C 11/5628 365/185.11 |
| 2016/0365154 A1 | 12/2016 | Nagadomi et al. | |

* cited by examiner

*Primary Examiner* — Muna A Techane
(74) *Attorney, Agent, or Firm* — Morgan, Lewis & Bockius, LLP

(57) ABSTRACT

A data storage includes a memory array including a plurality of memory cells, and peripheral circuitry disposed underneath the memory array. The peripheral circuitry includes an M-tier sense amplifier (SA) circuit including X stacks of SA latches, wherein each SA latch is respectively coupled to a bit line of a memory cell of the plurality of memory cells; and an N-tier memory cache data (XDL) circuit including Y stacks of XDL latches, wherein M is less than N, and X is greater than Y. The peripheral circuitry further includes data path circuitry coupling (i) each SA latch of the X stacks of SA latches to (ii) a respective XDL latch of the Y stacks of XDL latches.

10 Claims, 21 Drawing Sheets

SENSE AMPLIFIER MAPPING AND CONTROL SCHEME FOR NON-VOLATILE MEMORY

TECHNICAL FIELD

The present disclosure relates to a mapping and control scheme for a storage medium having different ratios of tiers of sense amplifiers and data latches.

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

A charge-trapping material can be used in non-volatile memory devices to store a charge which represents a data state. The charge-trapping material can be arranged vertically in a three-dimensional (3D) stacked memory array. One example of a 3D memory array is the Bit Cost Scalable (BiCS) architecture which comprises a stack of alternating conductive and dielectric layers. A memory hole is formed in the stack and a vertical NAND string is then formed by filling the memory hole with materials including a charge-trapping layer to create a vertical column of memory cells. Each memory cell can store one or more bits of data.

Non-volatile memories have supported the increased portability of consumer electronics, and have been utilized in relatively low power enterprise storage systems suitable for cloud computing and mass storage. The ever-present demand for almost continual advancement in these areas is often accompanied by demand to improve data storage capacity. The demand for greater storage capacity in turn stokes demand for greater performance (e.g., quicker reads and writes), so that the addition of storage capacity does not slow down the memory device. In addition, the demand for greater storage capacity stokes demand for chip size scaling (e.g., fitting larger memory arrays into smaller die areas). As such, there is ongoing pressure to increase the capacity and the operating speed of non-volatile memories and decrease the area requirements of such devices in order to further improve the useful attributes of such devices.

SUMMARY

This application describes various systems and methods of reducing the area required by peripheral circuitry in CMOS under array (CuA) memory structures. Such systems and methods use improved mapping and control schemes to transfer data between sense amplifier circuitry and memory cache circuitry, thereby supporting the implementation of peripheral circuitry that requires less space.

In one aspect, a data storage system, comprises a memory array including a plurality of memory cells, and peripheral circuitry disposed underneath the memory array. The peripheral circuitry includes an M-tier sense amplifier (SA) circuit including X stacks of SA latches, wherein each SA latch is respectively coupled to a bit line of a memory cell of the plurality of memory cells. The peripheral circuitry further includes an N-tier memory cache data (XDL) circuit including Y stacks of XDL latches, wherein M is less than N, and X is greater than Y. The peripheral circuitry further includes data path circuitry coupling (i) each SA latch of the X stacks of SA latches to (ii) a respective XDL latch of the Y stacks of XDL latches.

In some implementations, the data path circuitry includes a plurality of bus lines. Each bus line of the plurality of bus lines couples P SA latches to P XDL latches, wherein P is greater than or equal to 2. In some implementations, a first bus line of the plurality of bus lines includes a bridge connection between (i) an SA latch of a first stack of the X stacks, and (ii) an SA latch of a second stack of the X stacks. In some implementations, the first bus line couples the SA latch of the first stack of the X latches and the SA latch of the second stack of the X latches to two XDL latches of a first stack of the Y stacks of XDL latches.

In some implementations, the peripheral circuitry further comprises data transfer control circuitry including a plurality of control signals; and each of the plurality of control signals is coupled to (i) each SA latch of a first of the M tiers of the SA circuit, and (ii) a subset, less than all, of SA latches of a second of the M tiers of the SA circuit.

In some implementations, the first of the M tiers of the SA circuit is included in a first subset of SA tiers; the second of the M tiers of the SA circuit is included in a second subset of SA tiers; each SA tier of the first subset of SA tiers is connected to one control signal of the plurality of control signals; and each SA tier of the second subset of SA tiers is connected to two control signals of the plurality of control signals.

In some implementations, each of the plurality of control signals is configured to cause data to transfer between (i) SA latches coupled to a respective control signal, and (ii) corresponding XDL latches of the XDL circuit.

In some implementations, XDL latches in a first of the Y stacks are coupled to SA latches in a first and a second of the X stacks; XDL latches in a second of the Y stacks are coupled to SA latches in the second and a third of the X stacks; and XDL latches in a third of the Y stacks are coupled to SA latches in the third and a fourth of the X stacks.

In some implementations, SA latches in a first of the X stacks are coupled to XDL latches in a first of the Y stacks; SA latches in a second of the X stacks are coupled to XDL latches in the first and a second of the Y stacks; SA latches in a third of the X stacks are coupled to XDL latches the second and a third of the Y stacks; and SA latches in a fourth of the X stacks are coupled to XDL latches in the third of the Y stacks.

In some implementations, M is equal to 12; N is equal to 16; X is equal to 4; and Y is equal to 3.

In some implementations, the data path circuitry is configured to transfer all data stored in each SA latch of the X stacks to corresponding XDL latches of the Y stacks in N/2 data transfer cycles.

In some implementations, the data storage system further comprises a storage controller coupled to the peripheral circuitry via a storage medium interface, wherein the peripheral circuitry is configured to transfer data stored in the Y stacks of XDL latches to the storage controller via the storage medium interface during a read operation.

In another aspect, a method of transferring data in a data storage system is disclosed. The method comprises, at peripheral circuitry disposed underneath a memory array of a storage medium, the memory array including a plurality of memory cells, and in response to a read operation received at the peripheral circuitry from a storage controller: transferring data from a plurality of memory cells to an M-tier sense amplifier (SA) circuit including X stacks of SA latches, wherein each SA latch is respectively coupled to a bit line of a memory cell of the plurality of memory cells.

The method further comprises transferring the data from the M-tier SA circuit to an N-tier memory cache data (XDL) circuit including Y stacks of XDL latches, wherein M is less than N, and X is greater than Y, and the data is transferred from the M-tier SA circuit to the N-tier XDL circuit using data path circuitry coupling (i) each SA latch of the X stacks of SA latches to (ii) a respective XDL latch of the Y stacks of XDL latches.

The method further comprises transferring the data from the XDL circuit to the storage controller via a storage medium interface.

In some implementations, the data path circuitry includes a plurality of bus lines; each bus line of the plurality of bus lines couples P SA latches to P XDL latches, wherein P is greater than or equal to 2; a first bus line of the plurality of bus lines includes a bridge connection between (i) an SA latch of a first stack of the X stacks, and (ii) an SA latch of a second stack of the X stacks; and the first bus line couples the SA latch of the first stack of the X latches and the SA latch of the second stack of the X latches to two XDL latches of a first stack of the Y stacks of XDL latches.

In some implementations, the peripheral circuitry further comprises data transfer control circuitry including a plurality of control signals; and each of the plurality of control signals is coupled to (i) each SA latch of a first of the M tiers of the SA circuit, and (ii) a subset, less than all, of SA latches of a second of the M tiers of the SA circuit.

In some implementations, transferring the data from the M-tier SA circuit to the N-tier XDL circuit includes transferring data in SA latches in a first of the X stacks to XDL latches in a first of the Y stacks; transferring data in SA latches in a second of the X stacks to XDL latches in the first and a second of the Y stacks; transferring data in SA latches in a third of the X stacks to XDL latches the second and a third of the Y stacks; and transferring data in SA latches in a fourth of the X stacks to XDL latches in the third of the Y stacks.

In some implementations, M is equal to 12; N is equal to 16; X is equal to 4; and Y is equal to 3.

Various implementations of systems and methods within the scope of the appended claims each have several aspects, no single one of which is solely responsible for the desirable attributes described herein. Without limiting the scope of the appended claims, some prominent features are described. After considering this discussion, and particularly after reading the section entitled "Detailed Description" one will understand how the features of various implementations are used to improve performance at the interface.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

DETAILED DESCRIPTION

Figure 1:
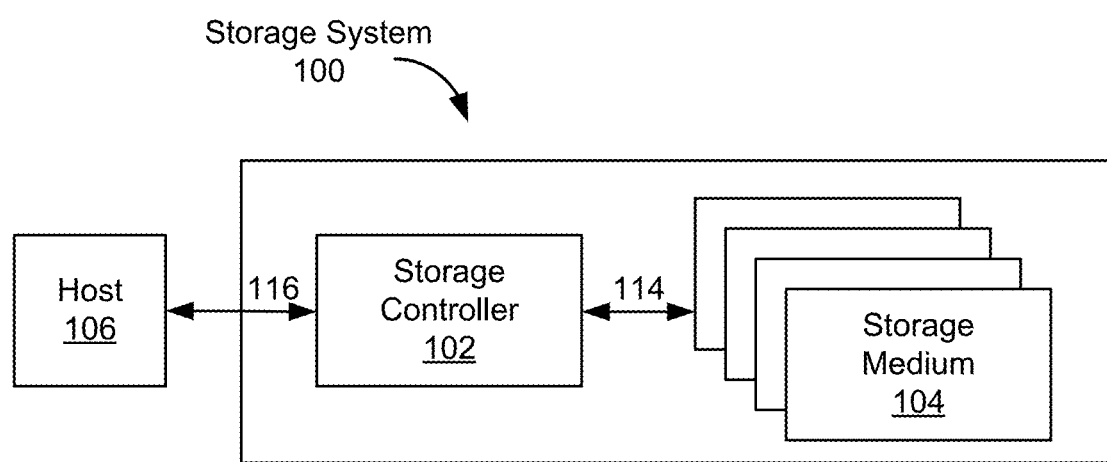
FIG. 1 is a functional block diagram of a non-volatile storage system in accordance with some implementations.

FIG. 1 is a functional block diagram of a non-volatile storage system in accordance with some implementations. Storage system 100 includes a storage controller 102 (sometimes referred to as a flash memory controller) and non-volatile memory that may be made up of one or more storage mediums 104 (sometimes referred to as memory dies). As used herein, the term storage medium (or memory die) refers to a plurality of non-volatile memory cells (e.g., one or more memory arrays), and associated circuitry (e.g., peripheral circuitry) for managing the physical operation of the non-volatile memory cells. In some implementations, the memory cells and associated circuitry are formed on a single semiconductor substrate. Storage controller 102 interfaces with a host system 106 (also referred to as a host) and transmits command sequences for read, program, and erase operations to storage medium(s) 104. Throughout this disclosure, reference may be made to a single storage medium 104. However, it should be understood that such features may additionally or alternatively be implemented across a plurality of storage mediums 104.

The storage controller 102 manages data stored on one or more storage mediums 104 (e.g., flash memory) and communicates with a host 106, such as a computer or electronic device. The storage controller 102 can have various functionality in addition to the specific functionality described herein. For example, the storage controller 102 can format the storage medium 104 to ensure the memory is operating properly, map out bad memory cells, and allocate spare memory cells to be substituted for future failed memory cells. Some part of the spare memory cells can be used to hold firmware to operate the storage controller 102 and implement other features.

In operation, when the host 106 needs to read data from or write data to a storage medium 104, the host 106 communicates with the storage controller 102. If the host 106 provides a logical address to which data is to be read/written, the storage controller 102 may convert the logical address received from the host 106 to a physical address in the storage medium 104. Alternatively, the host 106 may provide the physical address. The storage controller 102 may also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The storage medium(s) 104 may include any suitable non-volatile storage medium, including NAND flash memory cells and/or NOR flash memory cells. The memory cells can take the form of solid-state (e.g., flash) memory cells and can be one-time programmable, few-time programmable, or multi-time programmable. The memory cells can also be single-level cells (SLC), multiple-level cells (MLC), triple-level cells (TLC), quad-level cells (QLC), or use other memory cell level technologies. Also, the memory cells can be fabricated in a two-dimensional or three-dimensional fashion.

The interface between the storage controller 102 and the storage medium(s) 104 may be any suitable flash interface, such as Toggle Mode or Open NAND Flash Interface (ONFI).

In some implementations, storage system 100 may be a card-based system, such as a secure digital (SD) or a micro secure digital (micro-SD) card. In some implementations, storage system 100 may be part of an embedded storage system. For example, the storage controller 102 and storage medium(s) 104 may be embedded within the host 106, such as in the form of a solid-state disk (SSD) drive installed in a computer. Such an SSD may emulate, replace, or be used instead of a hard disk drive inside the host 106, or be used as a NAS device, and so forth. In any case, such an SSD need not be made to work as a hard drive.

Although in the example illustrated in FIG. 1, storage system 100 includes a single channel between storage controller 102 and storage medium 104, the subject matter described herein is not limited to having a single memory channel. For example, in some storage system architectures, two, four, eight, or more channels may exist between the storage controller 102 and the storage medium(s) 104, depending on controller capabilities. In any of the implementations described herein, a plurality of channels may exist between the storage controller 102 and the storage medium(s) 104, even if a single channel is depicted in the drawings.

In some implementations, an intermediate storage controller (not shown) may interface the host 106 with the storage controllers 102 of a plurality of storage systems 100. The interface between the intermediate storage controller and the plurality of storage systems 100 may be a bus interface, such as a serial advanced technology attachment (SATA) or peripheral component interface express (PCIe) interface. The plurality of storage systems 100 may be implemented in a solid state drive (SSD), such as found in portable computing devices, such as laptop computers, tablet computers, or mobile devices.

In some implementations, a plurality of intermediate storage controllers (not shown) may respectively interface the host 106 with the storage controllers 102 of a plurality of storage systems 100. Such a system may be referred to as a hierarchical storage system. The host 106 may access memories within the storage systems 100 via a bus interface. In some implementations, the bus interface may be an NVMe or fiber channel over Ethernet (FCoE) interface. In some implementations, a hierarchical storage system may be a rack mountable mass storage system that is accessible by multiple host 106 computers, such as would be found in a data center or other location where mass storage is needed.

Figure 2:
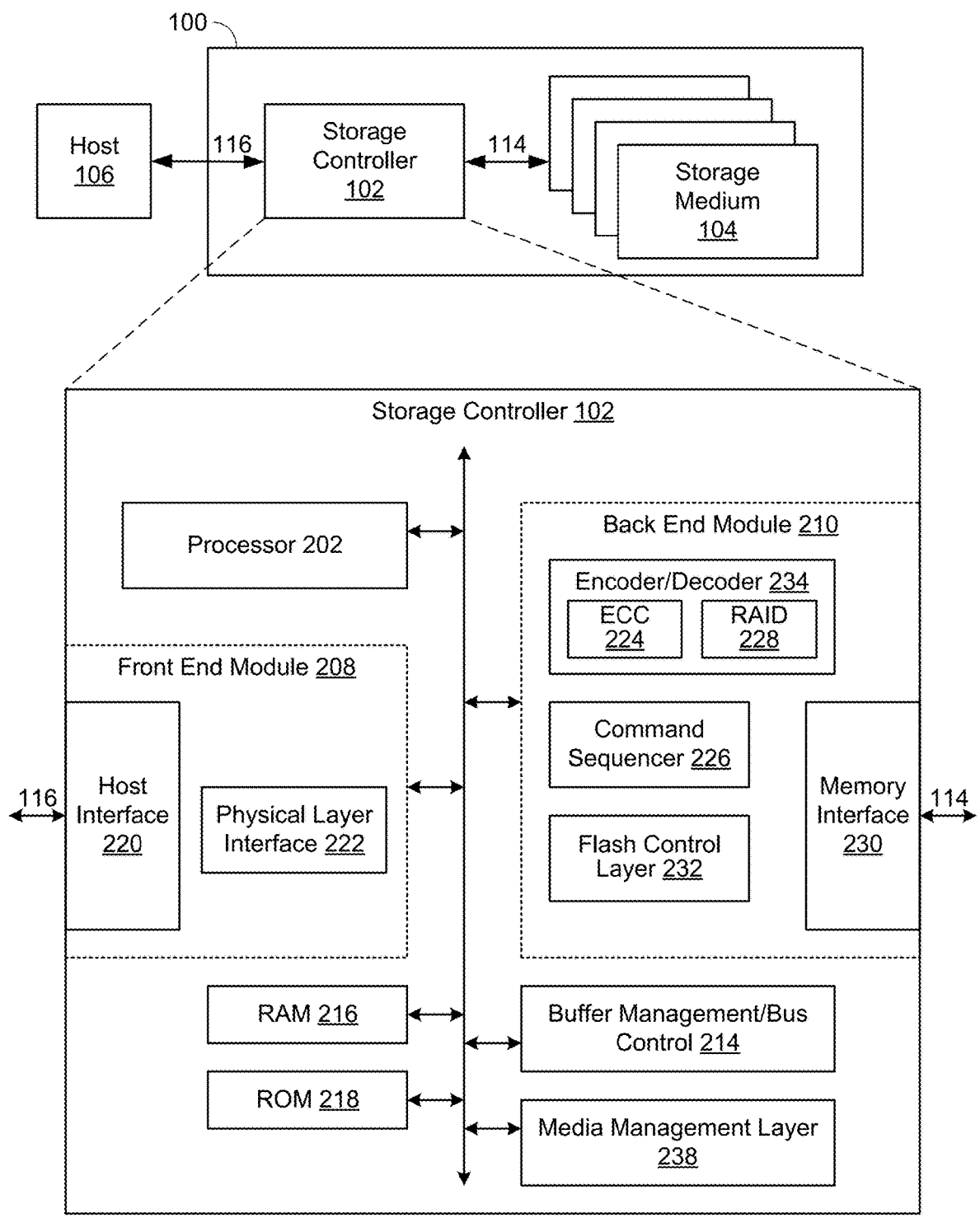
FIG. 2 is a functional block diagram of an example storage controller of the storage system depicted in FIG. 1 in accordance with some implementations.

FIG. 2 is a functional block diagram of an example storage controller 102 of the storage system 100 in accordance with some implementations. Storage controller 102 includes a front-end module 208 that interfaces with a host 106, a back-end module 210 that interfaces with one or more non-volatile storage mediums 104, and various other modules that perform functions described herein.

The storage controller 102 can take the form of processing circuitry, a microprocessor or processor, and a non-transitory computer-readable medium that stores computer-readable program code (e.g., firmware) executable by the (micro) processor, logic gates, switches, an application specific integrated circuit (ASIC), a programmable logic controller, and/or an embedded microcontroller, for example. Storage controller 102 can be configured with hardware and/or firmware to perform the various functions described herein. Also, some of the components shown as being internal to the storage controller 102 (e.g., RAM 216 and ROM 218) can also be stored external to the storage controller 102, and other components can be used. Additionally, the phrase "operatively in communication with" could mean directly in communication with or indirectly (wired or wireless) in communication with through one or more components, which may or may not be shown or described herein.

The components of storage controller 102 depicted in FIG. 2 may take the form of a packaged functional hardware unit (e.g., an electrical circuit) designed for use with other components, a portion of a program code (e.g., software or firmware) executable by a (micro)processor or processing circuitry (or one or more processors) that usually performs a particular function or related functions, or a self-contained hardware or software component that interfaces with a larger system. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, each module may include or comprise software stored in a processor readable device (e.g., memory) to program one or more processors for storage controller 102 to perform the functions described herein.

The storage controller 102 may include a buffer manager/bus controller 214, configured to manage buffers in random access memory (RAM) 216 and control the internal bus arbitration of the storage controller 102. A read only memory (ROM) 218 may store system boot code. Although illustrated in FIG. 2 as located within the storage controller 102, in some implementations one or both of the RAM 216 and ROM 218 may be located separately from the storage controller 102. In yet other implementations, portions of RAM 216 and ROM 218 may be located both within the storage controller 102 and outside the storage controller 102. Further, in some implementations, the storage controller 102, RAM 216, and ROM 218 may be located on separate semiconductor dies.

The storage controller 102 may include one or more processors 202 configured to control the overall operation of the storage controller 102. The processor 202 may issue commands to control circuitry 310 (FIG. 3) of storage medium 104, or to any other component of storage medium 104, via memory interface 230. In some implementations, the ROM 218 and/or RAM 216 may comprise code such as a set of instructions, and the processor 202 may be operable to execute the set of instructions to provide the functionality described herein. Additionally or alternatively, the processor 202 may access code from a portion of the memory array 350 (FIG. 3) in the storage medium 104, such as a reserved area of memory cells connected to one or more word lines.

The front-end module 208 includes a host interface 220 that provides a communication interface with the host 106. The choice of the type of host interface 220 can depend on the type of memory being used. Examples of host interfaces include, but are not limited to, SATA, SATA Express, SAS, Fibre Channel, USB, PCIe, and NVMe. The host interface 220 is a communication interface that facilitates transfer for data, control signals, and timing signals. The host interface 220 may include electrical interface circuitry that provides a physical connection to the channel(s) 116 connecting the storage controller 102 to the host. This electrical interface circuitry may be part of the host interface 220, or may be separately described as a physical layer interface 222.

In some implementations, the host interface 220, in communication with ROM 218, RAM 216, and/or processor 202, may be an electrical circuit that provides an electrical interface between the storage controller 102 and the host 106. For example, the host interface 220 may change the format or timing of signals, provide a buffer, isolate from surges, latch I/O, and so forth. Commands and data from the host 106 are received by the storage controller 102 via the host interface 220. Data sent to the host 106 is transmitted via the host interface 220.

The back-end module 210 includes a memory interface 230 that provides command sequences and data (to be written) to storage medium(s) 104 and receives status information and data (that was read) from storage medium(s) 104. In some implementations, the memory interface 230 may be a double data rate (DDR) interface such as Toggle Mode or ONFI.

In some implementations, the memory interface 230, in communication with ROM 218, RAM 216, and/or processor 202, may be an electrical circuit that provides an electrical interface between the storage controller 102 and the storage medium 104. For example, the memory interface 230 may change the format or timing of signals, provide a buffer, isolate from surges, latch I/O, and so forth.

The back-end module 210 may include an error correction controller (ECC) engine 224 and/or a Redundant Array of Independent Dies (RAID) module 228. The ECC engine 224 may be configured to encode data received from the host 106, and decode and error correct data read from the storage medium 104. The RAID module 228 may be configured to manage generation of RAID parity and recovery of failed data. The RAID parity may be used as an additional level of integrity protection for the data being written into the storage medium 104. In some implementations, the RAID module 228 may be a part of the ECC engine 224. The RAID parity may be added as an extra die or dies as implied by the common name, but it may also be added within the existing die, e.g., as an extra plane, or extra block, or extra WLs within a block. ECC engine 224 and RAID module 228 may both calculate redundant data that can be used to recover when errors occur and may be considered examples of redundancy encoders. Together, ECC engine 224 and RAID module 228 may be considered to form a combined redundancy encoder/decoder 234.

The back-end module 210 may include a command sequencer 226, and/or a flash control layer 232. The command sequencer 226 may generate command sequences, such as program and erase command sequences, for transmission to storage medium 104. The flash control layer 232 may control the overall operation of the back-end module 210.

The storage controller 102 may include a media management layer 238, which performs wear leveling of memory cells of storage medium 104. The storage controller 102 may also include other discrete components (not shown), such as external electrical interfaces, external RAM, resistors, capacitors, or other components that may interface with storage controller 102. In some implementations, one or more of the physical layer interface 222, RAID module 228, media management layer 238 and buffer management/bus controller 214 are optional components that are not necessary in the storage controller 102.

The Flash Translation Layer (FTL) or Media Management Layer (MML) 238 may be integrated as part of the flash management that may handle flash errors and interfacing with the host 106. In particular, the MML 238 may be a module in flash management and may be responsible for the internals of NAND management. In particular, the MML 238 may include an algorithm in the storage device firmware which translates writes from the host 106 into writes to the storage medium 104. The MML 238 may be needed because: 1) storage medium 104 may have limited endurance; 2) storage medium 104 may only be written in multiples of pages; and/or 3) a selected portion of memory cells of the storage medium 104 may not be written unless it is erased as a block (i.e. a block may be considered to be a minimum unit of erase and such a non-volatile memory may be considered a block-erasable non-volatile memory). The MML 238 may address these potential limitations of the storage medium 104 which may not be visible to the host 106. Accordingly, the MML 238 may translate write operations received from the host 106 into write operations for transmission to the storage medium 104.

Figure 3:
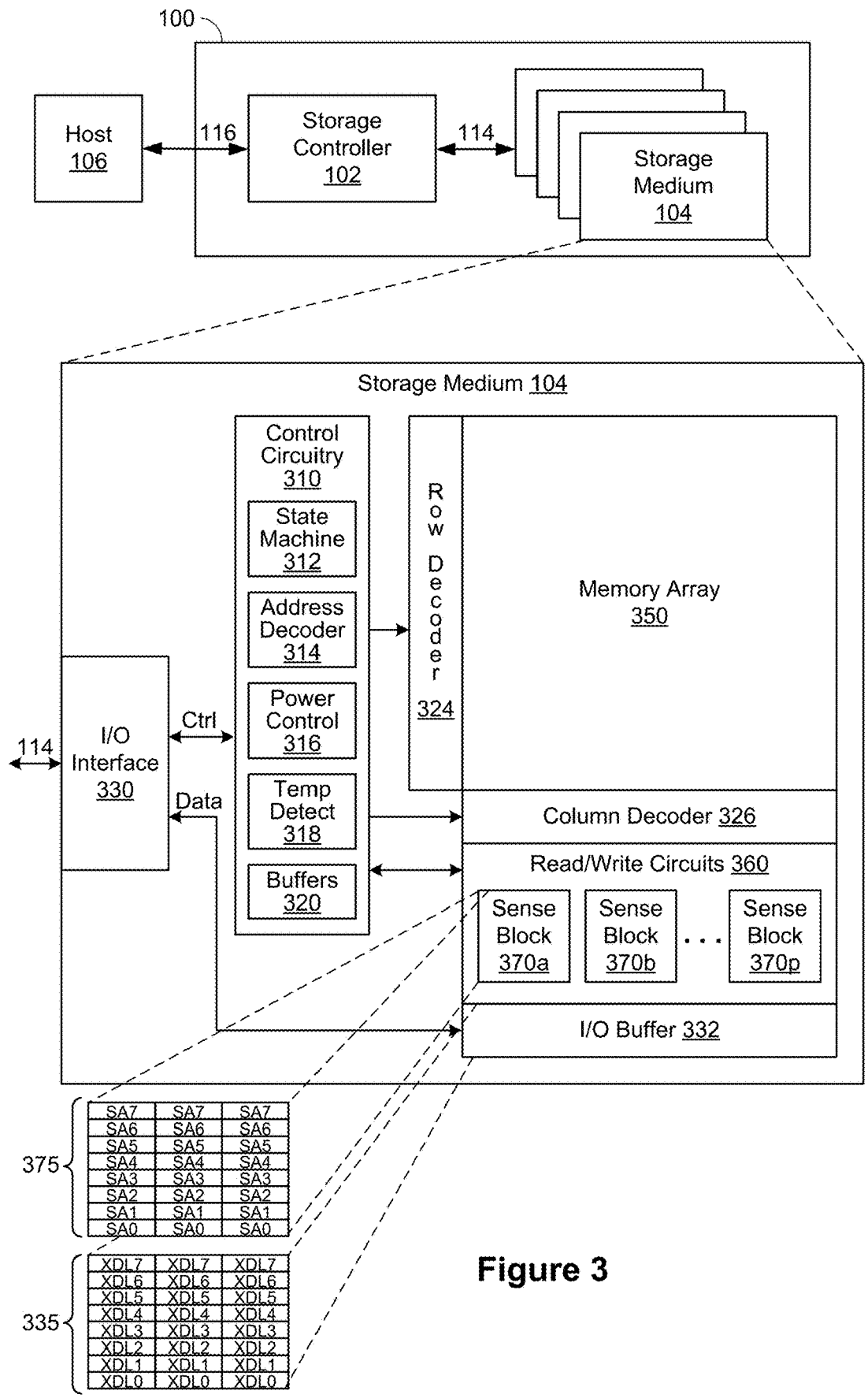
FIG. 3 is a functional block diagram of an example storage medium of the storage system depicted in FIG. 1 in accordance with some implementations.

FIG. 3 is a functional block diagram of an example storage medium 104 of the storage system 100 in accordance with some implementations. Storage medium 104 includes a memory array 350 including a plurality of memory cells, control circuitry 310, read/write circuits 360, and an input/output (I/O) interface 330.

In some implementations, a storage controller 102 (as described above with reference to FIG. 2) may included in the same storage device (e.g., a removable storage card) as the storage medium(s) 104. However, in other implementations, the storage controller 102 may be separated from the storage medium(s) 104. In some implementations, the storage controller 102 may be disposed on a different die than the storage medium 104. In some implementations, one storage controller 102 may communicate with a plurality of storage mediums 104. In some implementations, each storage medium 104 may have its own storage controller 102.

Commands and data may be transferred between the host 106 and the storage controller 102 via a data bus 116, and between the storage controller 102 and storage medium(s) 104 via an interface channel 114. In some implementations, the I/O interface 330 includes a set of I/O pins (also referred to as pads) that connect to respective communication lines of the interface channel 114. The I/O interface 330 may be connected to the control circuitry 310, row decoder 324, column decoder 326, read/write circuits 360, and/or memory array 350.

The I/O interface 330 may be a synchronous interface or an asynchronous interface. Examples of an I/O interface include a Toggle Mode Interface and an Open NAND Flash Interface (ONFI). Other I/O interfaces can also be used. Toggle mode (e.g., Toggle Mode 2.0 JEDEC Standard or Toggle Mode 800) is an asynchronous memory interface that supports SDR and DDR with a DQS signal acting as a data strobe signal.

Data received at the I/O interface 330 for writing to the memory array 350 (in accordance with a write command) is latched in an I/O buffer 332 before being written to the memory array 350. Similarly, data that is read from the memory array 350 (in accordance with a read command) is latched in the I/O buffer 332 before being transmitted to the storage controller 102 via the I/O interface 330. The I/O buffer 332 may be included in the I/O interface 330 or otherwise communicatively coupled to the I/O interface 330. The I/O buffer 332 includes a plurality of data latches 335. In some implementations, the data latches 335 are arranged in groups of 8 (XDL0 through XDL7) or 16 (XDL0 through XDL15), depending on how many bits the I/O interface 330 is configured to receive or transmit at a time.

The read/write circuits 360 include multiple sense blocks 370 including 370a through 370p (sensing circuitry) and allow a page (or multiple pages) of data in multiple memory cells of the memory array 350 to be read or programmed (written) in parallel. In some implementations, each sense block 370 includes one or more sense amplifiers (SA) 375 connected to respective bit lines of the memory array 350. The sense amplifiers sense voltage signals associated with selected memory cells (e.g., determining whether a given memory cell is conducting current during a sense operation, or how much current the given memory cell conducts during the sense operation). The sense amplifiers then amplify the sensed voltages to levels that are optimized for the I/O circuitry of the storage medium 104, interface channel 114, and storage controller 102.

Each bit line of the memory array 350 is coupled to a sense block 370, each of which includes one or more sense amplifiers. The sense amplifiers sense voltages on each bit line in accordance with read operations. The sense amplifiers sense the low power signals from respective bitlines that represents data bits (1 or 0) stored in respective memory cells. The sense amplifiers amplify small voltage swings to recognizable logic levels so the data can be interpreted properly by logic outside the memory array (e.g., storage controller 102). After a sense amplifier for a particular bit line amplifies the sensed voltage to a normal logic level, the bit from the desired cell is then latched from the cell's sense amplifier into a data latch in the I/O buffer 332, and transferred to the storage controller 102 on data lines DQ of the output bus 114.

The sense amplifiers sense data read onto corresponding bit lines from a plurality of memory cells associated with the corresponding bit lines. The sense amplifiers may include bit line drivers for applying a voltage to corresponding bit lines in accordance with write data. The sense amplifier for a given bit line or group of bit lines may directly control the bit line(s). In data reading, the read/write circuits 360 may apply a strobe signal to a given sense amplifier. The sense amplifier determines data at the assertion timing of the strobe signal (e.g., an ON state of a memory cell may be defined as data "0", and an off state may be defined as data "1"). This data may be held in an internal latch SADL of the sense amplifier before being transferred to one of the data latches 335 of the I/O buffer 332.

Input and output of data to and from the sense amplifiers 375 are performed via the data latches 335 of the I/O buffer 332. That is, data received from the storage controller 102 is transferred to sense amplifiers 375 via data latches 335. In addition, data in the sense amplifiers 375 (in internal latches of the sense amplifiers) is transmitted to the storage controller 102 via data latches 335. The data latches 335 of the I/O buffer 332 may function as the cache memory of the storage medium 104.

The control circuitry 310 cooperates with the read/write circuits 360 to perform memory operations (e.g., write, read, erase, and others) on the memory array 350. In some implementations, control circuitry 310 includes a state machine 312, an on-chip address decoder 314, a power control circuit 316, a temperature detection circuit 318, and/or buffers 320.

The state machine 312 provides die-level control of memory operations. In some implementations, the state machine 312 is programmable by software. In other implementations, the state machine 312 does not use software and is completely implemented in hardware (e.g., electrical circuits). In some implementations, the state machine 312 can be replaced by a microcontroller or microprocessor.

The address decoder 314 provides an address interface between addresses used by the host 106 or storage controller 102 to the hardware address used by the decoders 324 and 326.

The power control module 316 controls the power and voltages supplied to the word lines and bit lines during memory operations. It can include drivers for word line layers (discussed below) in a 3D configuration, select transistors (e.g., SGS and SGD transistors, described below) and source lines. Power control module 316 may include charge pumps for creating voltages.

The temperature detection circuit 318 may be configured to detect temperature in or around the storage medium 104. The temperature detection circuit 318 may include an on-chip temperature sensor.

The buffers 320 may be registers, ROM fuses, and/or other storage devices for storing default values such as base voltages and other parameters.

Any one or any combination of control circuitry 310, state machine 312, decoders 314/324/326, temperature detection circuit 318, power control module 316, sense blocks 370, read/write circuits 360, and storage controller 102 can be considered one or more control circuits (or managing circuitry, or peripheral circuitry) that performs the functions described herein.

The memory array 350 may be addressable by word lines via a row decoder 324 and by bit lines via a column decoder 326. The memory array 350 may comprise one or more 2D or 3D arrays of memory cells. The memory array 350 may comprise a monolithic 3D memory array in which multiple memory levels are formed above (and not in) a single substrate, such as a wafer, with no intervening substrates. The memory array 350 may comprise any type of non-volatile memory that is monolithically formed in one or more physical levels of arrays of memory cells having an active area disposed above a silicon substrate. The memory array 350 may be in a non-volatile memory device having circuitry associated with the operation of the memory cells, whether the associated circuitry is above or within the substrate.

Multiple memory elements in memory array 350 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors. In some implementations, the non-volatile memory cells of memory array 350 comprise vertical NAND strings with charge-trapping material. In such a configuration, a NAND string includes memory cells connected by a channel.

A NAND flash memory array 350 may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three-dimensional memory array 350 may be arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three-dimensional memory array 350 may be vertically arranged as a stack of multiple two-dimensional memory device levels. As another non-limiting example, a three-dimensional memory array 350 may be arranged as multiple vertical columns (e.g., columns extending substantially perpendicular to the major surface of the substrate, i.e., in the y direction) with each column having multiple memory cells. The vertical columns may be arranged in a two-dimensional configuration, e.g., in an x-y plane, resulting in a three-dimensional arrangement of memory cells, with memory cells on multiple vertically stacked memory planes. Other configurations of memory elements in three dimensions can also constitute a three-dimensional memory array.

By way of a non-limiting example, in a three-dimensional NAND memory array, the memory elements may be coupled together to form vertical NAND strings that traverse across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

In some implementations, the memory array 350 comprises a two dimensional memory array of non-volatile memory cells. In one example, the non-volatile memory cells are NAND flash memory cells utilize floating gates. Other types of memory cells (e.g., NOR-type flash memory) can also be used.

The exact type of memory array architecture or memory cells included in the memory array 350 is not limited to the examples above. Many different types of memory array architectures or memory cell technologies can be used to form the memory array 350. No particular non-volatile memory technology is required for purposes of the implementations described herein. Other examples of suitable technologies for memory cells of the memory array 350 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of the memory array 350 include two dimensional arrays, three dimensional arrays, cross-point arrays, stacked two dimensional arrays, vertical bit line arrays, and the like.

A person of ordinary skill in the art will recognize that the technology described herein is not limited to a single specific memory array, but covers many relevant memory arrays within the spirit and scope of the technology as described herein and as understood by one of ordinary skill in the art.

Figure 4A:
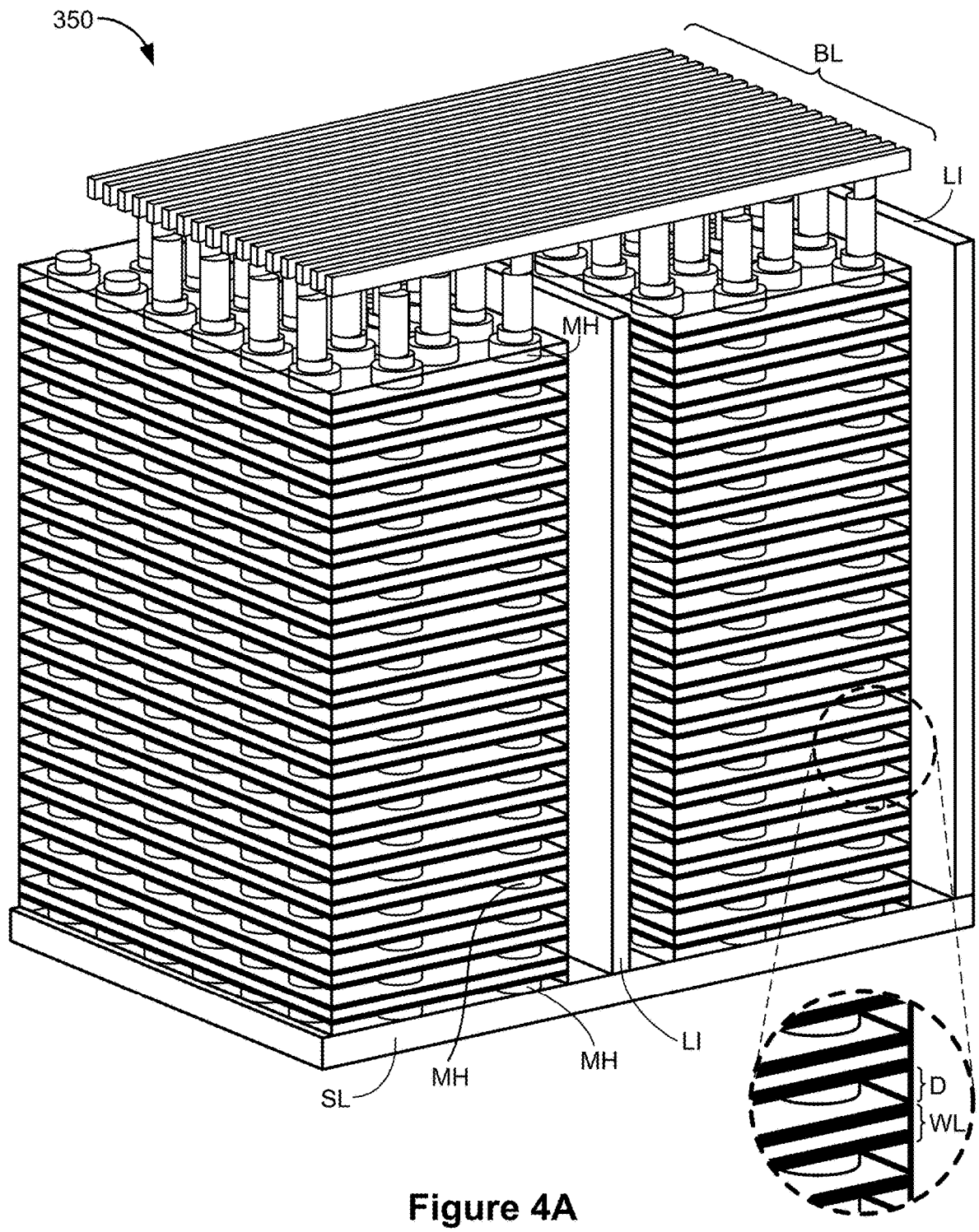
FIG. 4A is a perspective view of a portion of one implementation of a three-dimensional monolithic memory array in accordance with some implementations.

FIG. 4A is a perspective view of a portion of an example implementation of a monolithic three dimensional memory array that may comprise memory array 350, which includes a plurality of non-volatile memory cells. For example, FIG. 4A shows a portion of one block of memory. The structure depicted includes a set of bit lines BL positioned above a stack of alternating dielectric layers and conductive layers with vertical columns of materials extending through the dielectric layers and conductive layers. For example purposes, one of the dielectric layers is marked as D and one of the conductive layers (also called word line layers) is marked as WL.

The number of alternating dielectric layers and conductive layers can vary based on specific implementation requirements. One set of implementations includes between 104-216 alternating dielectric layers and conductive layers. One example implementations includes 96 data word line layers, 8 select layers, 6 dummy word line layers and 110 dielectric layers. More or less than 104-216 layers can also be used. As will be explained below, the alternating dielectric layers and conductive layers may be divided into four "fingers" or sub-blocks by local interconnects LI. FIG. 4A shows two fingers and two local interconnects LI. Below the alternating dielectric layers and word line layers is a source line layer SL. Vertical columns of materials (also known as memory holes) are formed in the stack of alternating dielectric layers and conductive layers. For example, one of the vertical columns/memory holes is marked as MH. Note that in FIG. 4A, the dielectric layers are depicted as see-through so that the reader can see the memory holes positioned in the stack of alternating dielectric layers and conductive layers. In some implementations, NAND strings are formed by filling the vertical column/memory hole with materials including a charge-trapping material to create a vertical column of memory cells. Each memory cell can store one or more bits of data. More details of the three dimensional monolithic memory array that comprises memory array 350 is provided below with reference to FIG. 4B-4F.

Figure 4B:
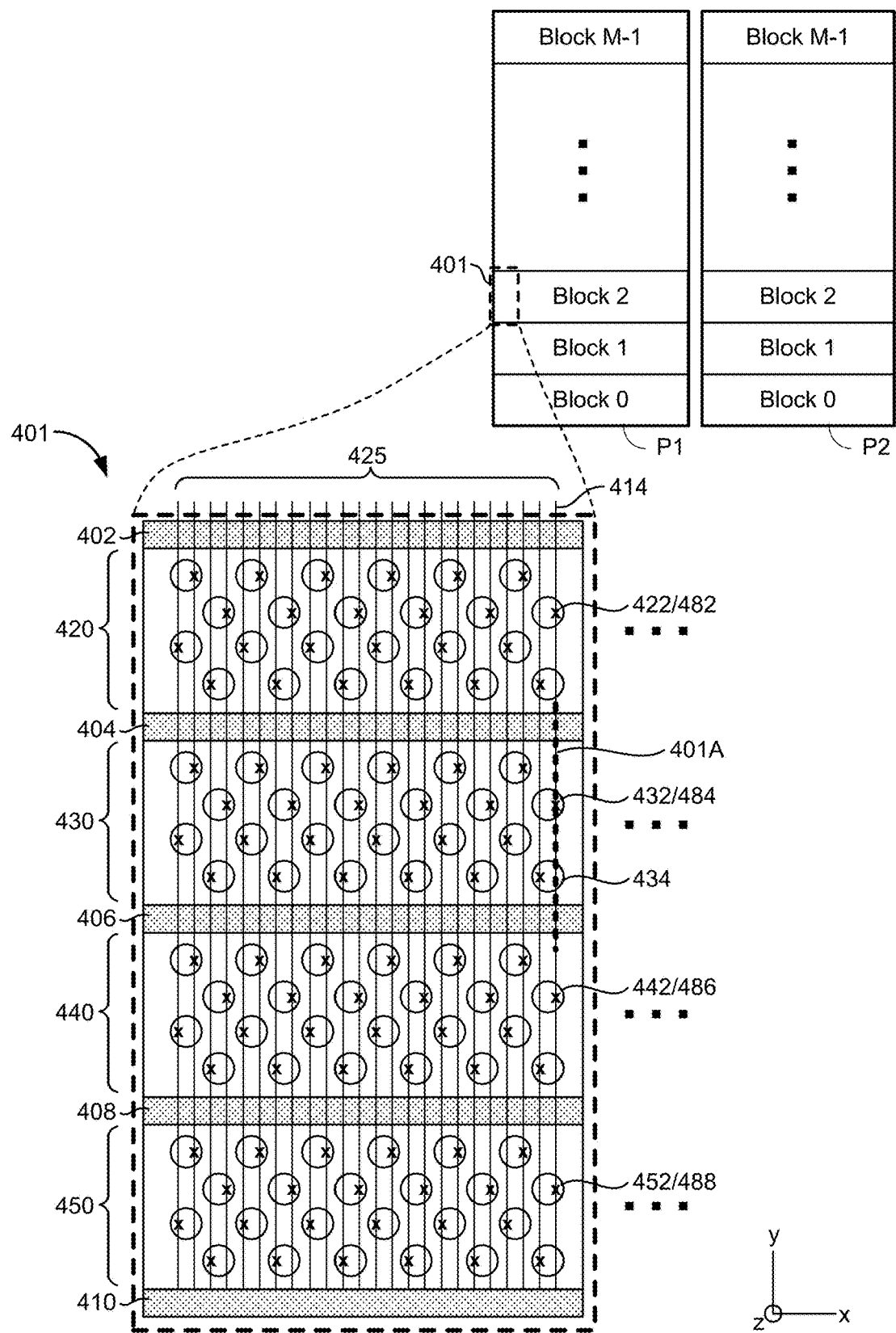
FIG. 4B is a block diagram of a memory array having two planes, and a top view of a portion of a block of memory cells in accordance with some implementations.

FIG. 4B depicts an example three dimensional (3D) NAND structure that corresponds to the structure of FIG. 4A and can be used to implement memory array 350 of FIG. 3. The memory array 350 may be divided into two planes P1 and P2. Each plane may be divided into M blocks. In one example, each plane has about 2000 blocks. However, different numbers of blocks and planes can also be used. In some implementations, a block of memory cells is a unit of erase. That is, all memory cells of a block are erased together.

In some implementations, memory cells can be grouped into blocks for other reasons, such as to organize the memory array 350 to enable the signaling and selection circuits. In some implementations, a block represents a groups of connected memory cells as the memory cells of a block share a common set of unbroken word lines and unbroken bit lines. Block 0 and block M−1 of both planes P1 and P2 may be referred to as being located in an edge region/section of the memory array 350.

FIG. 4B further includes a detailed top view of a portion 401 of one block from the memory array 350. The block depicted in portion 401 extends in the x direction. In some implementations, the memory array 350 has many layers; however, FIG. 4B only shows the top layer.

FIG. 4B depicts a plurality of circles that represent the vertical columns MH. Each of the vertical columns include multiple select transistors (also referred to as a select gate or selection gate) and multiple memory cells. In some implementations, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the x direction, the block includes more vertical columns than depicted in FIG. 4B.

FIG. 4B also depicts a set of bit lines 425, including bit line 414. FIG. 4B shows twenty four bit lines because only a portion of the block is depicted. More than twenty four bit lines may be connected to vertical columns of the block. Each of the circles representing vertical columns has an "x" to indicate its connection to one bit line. For example, bit line 414 is connected to vertical columns 422, 432, 442 and 452 (but not vertical column 434). In some implementations, bit lines are positioned over the memory array 350 and run along the entire length of the plane (e.g., from the top of plane P1 to the bottom of plane P1).

The block depicted in FIG. 4B includes a set of local interconnects 402, 404, 406, 408, and 410 that connect the various layers to a source line below the vertical columns. Local interconnects 402, 404, 406, 408, and 410 also serve to divide each layer of the block into four regions. For example, the top layer depicted in FIG. 4B is divided into regions 420, 430, 440, and 450, which are referred to as fingers or sub-blocks. In the layers of the block that implement memory cells, the four regions are referred to as word line fingers that are separated by the local interconnects.

In some implementations, the word line fingers on a common level of a block connect together to form a single word line. In some implementations, the word line fingers on the same level are not connected together. In one example implementation, a bit line only connects to one vertical column in each of regions 420, 430, 440 and 450. For such an implementation, each block has sixteen rows of active columns and each bit line connects to four rows in each block. In some implementations, all of four rows connected to a common bit line are connected to the same word line (via different word line fingers on the same level that are connected together). Therefore, the address decoders use the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other implementations may include more or less regions per block, more or less rows of vertical columns per region and more or less rows of vertical columns per block. FIG. 4B also shows the vertical columns being staggered. In other implementations, different patterns of staggering can be used. In some implementations, the vertical columns are not staggered.

Figure 4C:
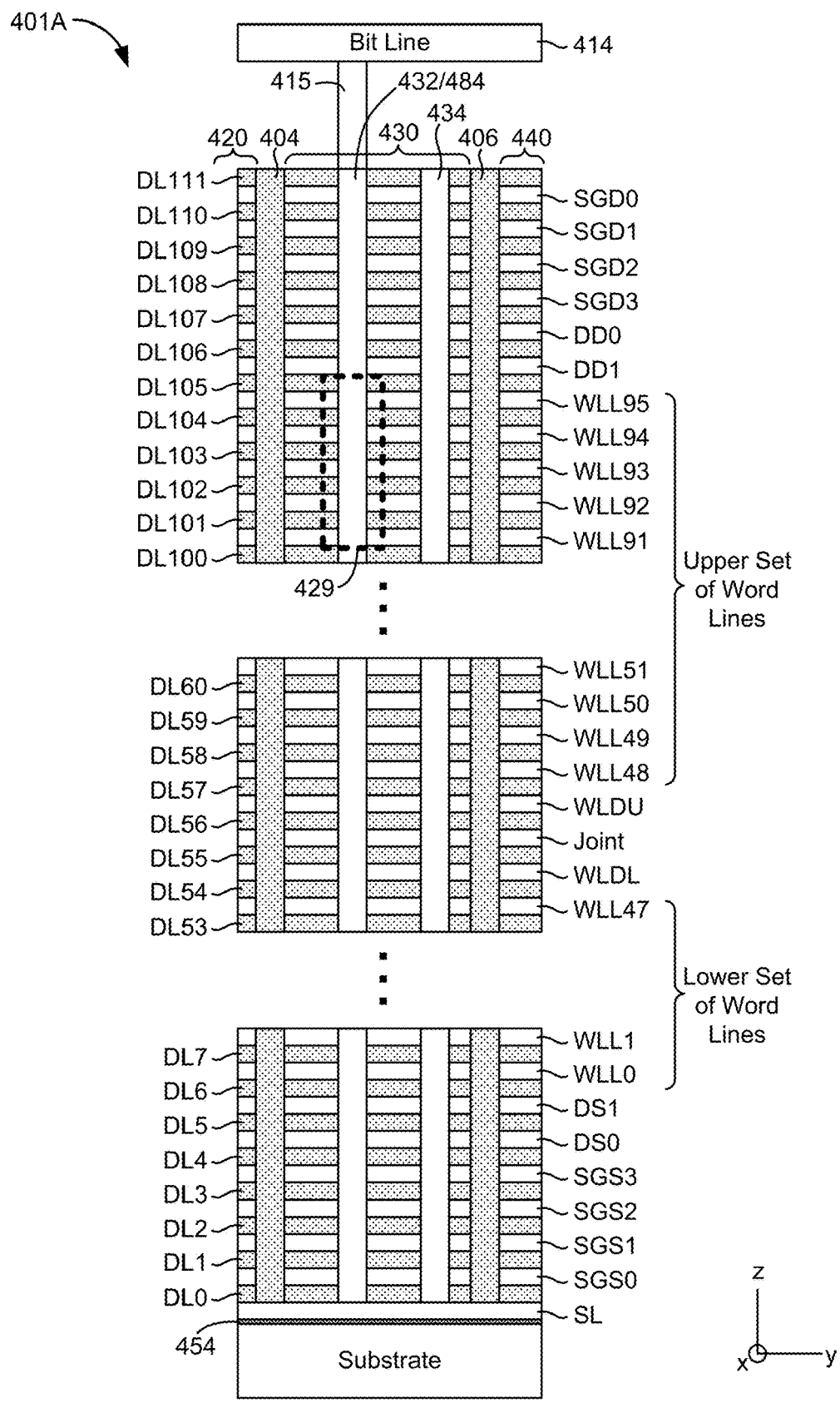
FIG. 4C depicts a cross sectional view of a portion of a block of memory cells in accordance with some implementations.

FIG. 4C depicts a portion of some implementations of the three dimensional memory array 350 showing a cross-sectional view along line 401A of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; six dummy word line layers DD0, DD1, DS0, DS1, WLDL, WLDU; and ninety-six data word line layers WLL0-WLL95 for connecting to data memory cells. Other implementations can implement more or less than four drain side select layers, more or less than four source side select layers, more or less than six dummy word line layers, and more or less than ninety six word lines.

Vertical columns 432 and 434 are depicted protruding through the drain side select layers, source side select layers, dummy word line layers and word line layers. In some implementations, each vertical column comprises a vertical NAND string. For example, vertical column 432 comprises NAND string 484. Below the vertical columns and the layers listed below is the substrate, an insulating film 454 on the substrate, and the source line SL. The NAND string of vertical column 432 has a source end at a bottom of the stack and a drain end at a top of the stack. As in agreement with FIG. 4B, FIG. 4C shows vertical column 432 connected to bit line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0, DS1, WLDL and WLDU; and word line layers WLL0-WLL95 collectively are referred to as the conductive layers. In some implementations, the conductive layers are made from a combination of TiN and Tungsten. In other implementations, other materials can be used to form the conductive layers, such as doped polysilicon, metal such as Tungsten or metal silicide. In some implementations, different conductive layers can be formed from different materials. Between conductive layers are dielectric layers DL0-DL111. For example, dielectric layer DL104 is above word line layer WLL94 and below word line layer WLL95. In some implementations, the dielectric layers are made from SiO2. In other implementations, other dielectric materials can be used to form the dielectric layers.

The non-volatile memory cells are formed along vertical columns which extend through alternating conductive and dielectric layers in the stack. In some implementations, the memory cells are arranged in NAND strings. The word line layers WLL0-WLL95 connect to memory cells (also called data memory cells). Dummy word line layers DD0, DD1, DS0, DS1, WLDL and WLDU connect to dummy memory cells. A dummy memory cell does not store and is not eligible to store host data (data provided from the host 106, such as data from a user of the host 106), while a data memory cell is eligible to store host data. In some implementations, data memory cells and dummy memory cells may have the same structure. A dummy word line is connected to dummy memory cells. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4C also shows a Joint area. In some implementations it is expensive and/or challenging to etch ninety six word line layers intermixed with dielectric layers. To ease this burden, some implementations include laying down a first stack of forty eight word line layers alternating with dielectric layers, laying down the Joint area, and laying down a second stack of forty eight word line layers alternating with dielectric layers. The Joint area is positioned between the first stack and the second stack. The Joint area is used to connect the first stack to the second stack. In FIG. 4C, the first stack is labeled as the "Lower Set of Word Lines" and the second stack is labeled as the "Upper Set of Word Lines." In some implementations, the Joint area is made from the same materials as the word line layers. In one example set of implementations, the plurality of word lines (control lines) comprises a first stack of alternating word line layers and dielectric layers, a second stack of alternating word line layers and dielectric layers, and a joint area between the first stack and the second stack, as depicted in FIG. 4C.

Figure 4D:
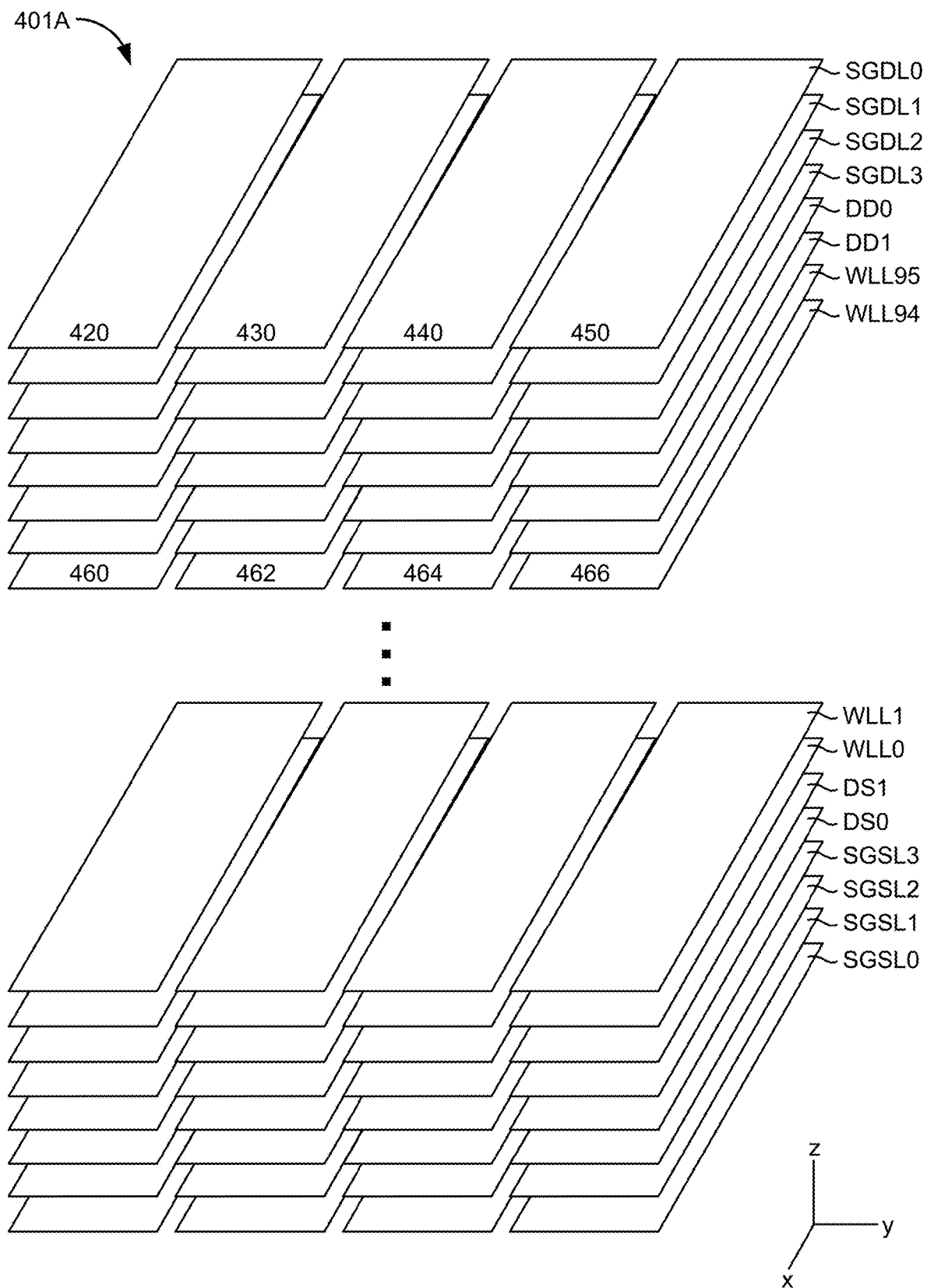
FIG. 4D depicts a view of the select gate layers and word line layers in accordance with some implementations.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL95) for the block that is partially depicted in FIG. 4C. As mentioned above with reference to FIG. 4B, in some implementations local interconnects 402, 404, 406, 408, and 410 break up the conductive layers into four regions/fingers (or sub-blocks). For example, word line layer WLL94 is divided into regions 460, 462, 464, and 466. For the word line layers (WLL0-WLL95), the regions are referred to as word line fingers. For example, word line layer WLL94 is divided into word line fingers 460, 462, 464, and 466. For example, region 460 is one word line finger on one word line layer. In some implementations, each word line finger on the same level is connected together. In some implementations, each word line finger operates as a separate word line.

Drain side select gate layer SGD0 (the top layer) is also divided into regions 420, 430, 440, and 450, also known as fingers or select line fingers. In some implementations, each select line finger on the same level is connected together. In some implementations, each select line finger operates as a separate word line.

Figure 4E:
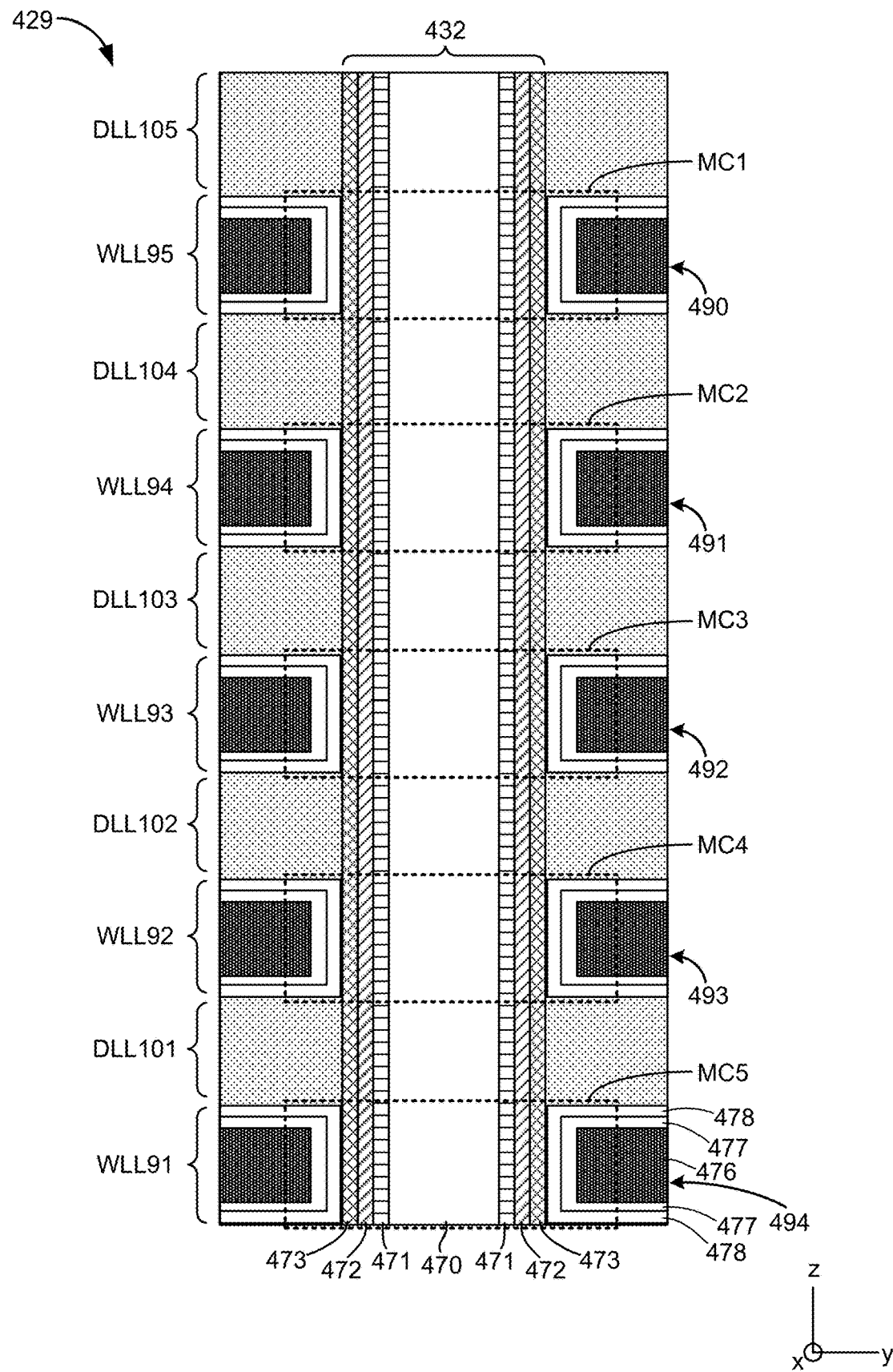
FIG. 4E is a cross sectional view of a vertical column of memory cells in accordance with some implementations.

FIG. 4E depicts a cross sectional view of region 429 of FIG. 4C that includes a portion of vertical column 432 (a memory hole) that extends through the alternating conductive layers and dielectric layers. In some implementations, the vertical columns are round; however, in other implementations other shapes can be used. In some implementations, vertical column 432 includes an inner core layer 470 that is made of a dielectric, such as SiO2. Other materials can also be used. Surrounding inner core 470 is polysilicon channel 471. Materials other than polysilicon can also be used. Note that it is the channel 471 that connects to the bit line and the source line. Surrounding channel 471 is a tunneling dielectric 472. In some implementations, tunneling dielectric 472 has an ONO structure. Surrounding tunneling dielectric 472 is charge trapping layer 473, such as (for example) silicon nitride. Other memory materials and structures can also be used. The technology described herein is not limited to any particular material or structure.

FIG. 4E depicts dielectric layers DLL105, DLL104, DLL103, DLL102, and DLL101, as well as word line layers WLL95, WLL94, WLL93, WLL92, and WLL91. Each of the word line layers includes a word line region 476 surrounded by an aluminum oxide layer 477, which is surrounded by a blocking oxide (e.g., SiO2) layer 478. The physical interaction of the word line layers with the vertical column forms the memory cells. Thus, a memory cell, in some implementations, comprises channel 471, tunneling dielectric 472, charge trapping layer 473, blocking oxide layer 478, aluminum oxide layer 477 and word line region 476.

For example, word line layer WLL95 and a portion of vertical column 432 comprise a memory cell MC1. Word line layer WLL94 and a portion of vertical column 432 comprise a memory cell MC2. Word line layer WLL93 and a portion of vertical column 432 comprise a memory cell MC3. Word line layer WLL92 and a portion of vertical column 432 comprise a memory cell MC4. Word line layer WLL91 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In some implementations, the programming is achieved through Fowler-Nordheim tunneling of the electrons into the charge trapping layer. During an erase operation, the electrons return to the channel or holes are injected into the charge trapping layer to recombine with electrons. In some implementations, erasing is achieved using hole injection into the charge trapping layer via a physical mechanism such as gate induced drain leakage (GIDL).

Figure 4F:
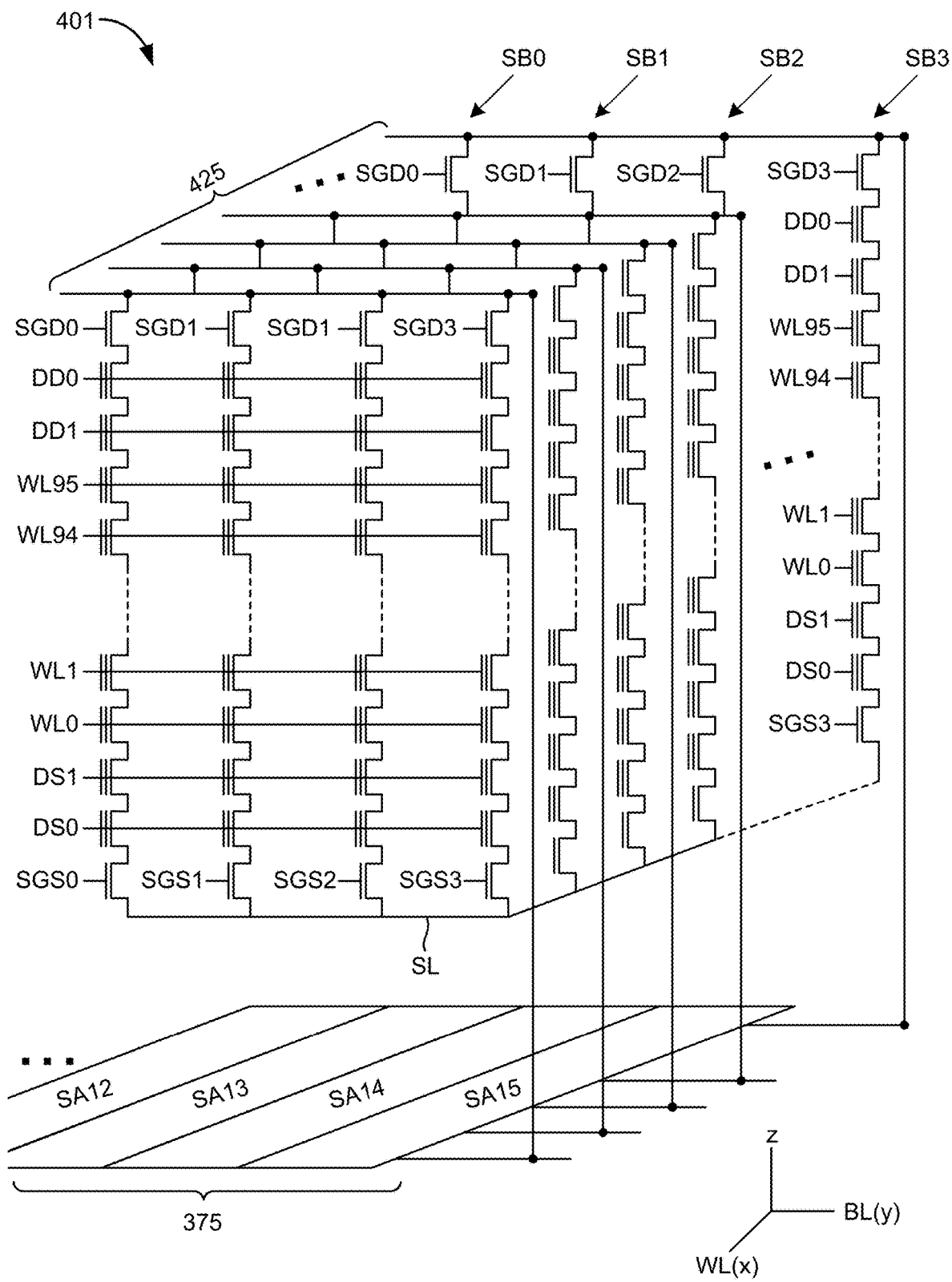
FIG. 4F is a schematic of a plurality of NAND strings in accordance with some implementations.

FIG. 4F is a schematic diagram of a portion of the memory array 350 depicted in FIGS. 4A-4E. FIG. 4A shows physical word lines WLL0-WLL95 running across the entire block. The structure of FIG. 4F corresponds to portion 401 in Block 2 of FIGS. 4B-4E including bit lines 425. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Each bit line 425 is connected to sense amplifiers 375 in the peripheral circuitry of the storage medium 104. The sense amplifiers sense voltage signals associated with selected memory cells of the respective NAND strings corresponding to each bit line (e.g., determining whether a given memory cell is conducting current during a sense operation, or how much current the given memory cell conducts during the sense operation). The sense amplifiers then amplify the sensed voltages to levels that are optimized for the I/O circuitry of the storage medium 104, interface channel 114, and storage controller 102.

Figures 5A, 5B, 5C:
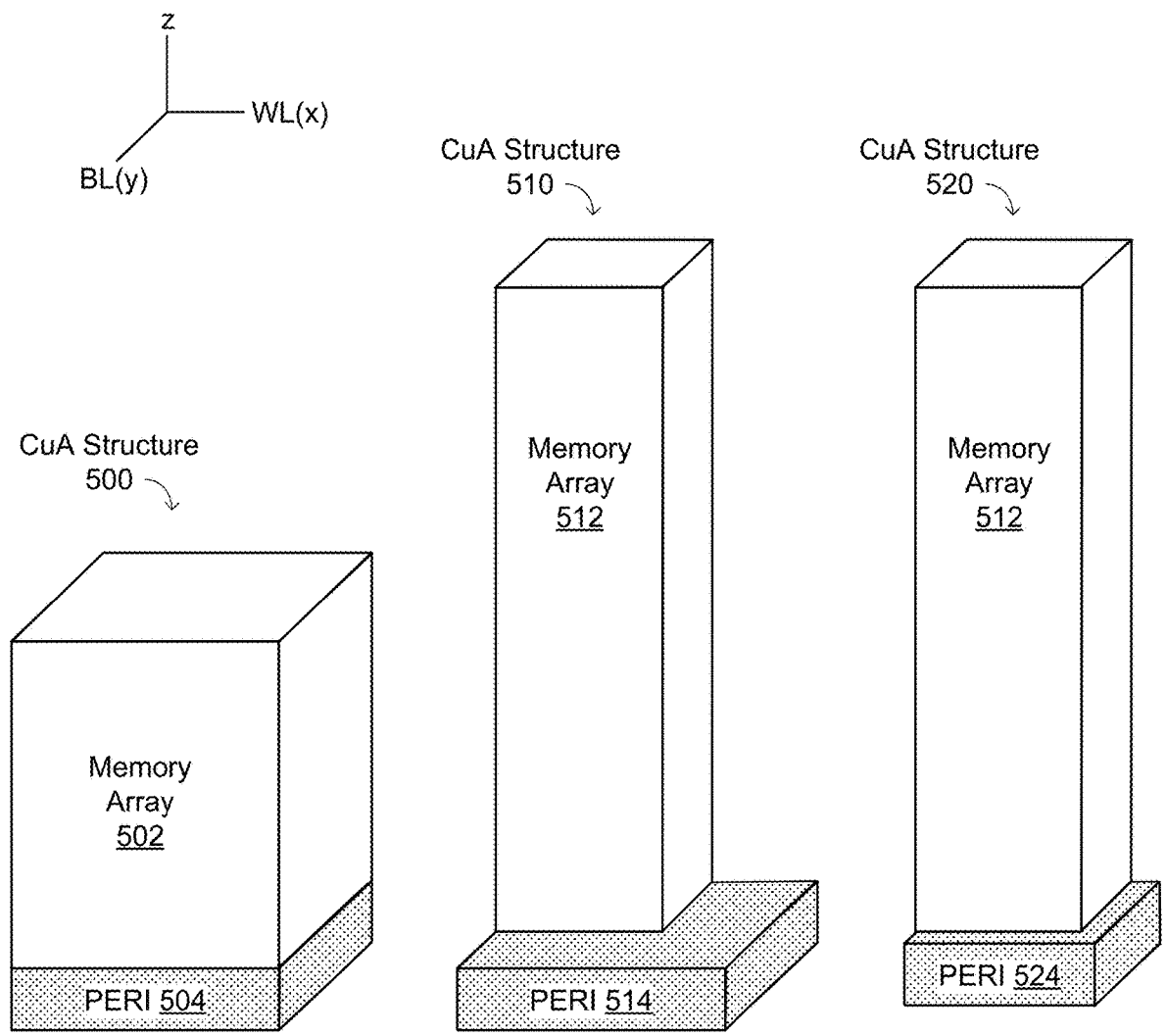
FIG. 5A is a perspective view of a CMOS under array (CUA) memory structure in accordance with some implementations.
FIG. 5B is a perspective view of a CUA memory structure with a dominant peripheral area in accordance with some implementations.
FIG. 5C is a perspective view of a CUA memory structure 520 with a reduced peripheral area in accordance with some implementations.

FIG. 5A is a perspective view of a CMOS under array (CuA) memory structure 500 in accordance with some implementations. CuA structure 500 includes a memory array 502 and peripheral circuitry 504.

Memory array 502 corresponds to the three-dimensional memory array 350 described above with reference to FIGS. 3 and 4A-4F. In one example implementation, the length of the plane in the x-direction represents a direction in which signal paths for word lines extend (a word line or SGD line direction), and the width of the plane in the y-direction, represents a direction in which signal paths for bit lines extend (a bit line direction). The z-direction represents a height of the storage device.

Peripheral circuitry 504 corresponds to any one or any combination of control circuitry 310, state machine 312, decoders 314/324/326, temperature detection circuit 318, power control module 316, sense blocks 370, read/write circuits 360, and storage controller 102 described above with reference to FIGS. 1-4F. For example, peripheral circuitry 504 may include voltage regulators, charge pumps, page buffers, sense amplifiers, logic circuits, redundancy structures, and so forth.

Peripheral circuitry 504 is implemented underneath the vertical stack of memory cells in memory array 502. Implementing the peripheral circuitry 502 underneath the memory 502 saves die space (allowing more die space to be used for memory cells) and increases the amount of space available for peripheral circuitry.

Due to chip size scaling, the memory cells in the memory array continue to shrink, which allows the x-y footprint to decrease, and allows additional memory cells to be vertically stacked in the z direction. For example, while memory array 502 may include 162 word line layers, memory array 512 in FIG. 5B may include 224 word line layers. The amount of peripheral circuitry required to manage the additional memory cells, however, may require a larger footprint (more die space) than the memory array requires, thereby causing the peripheral area to become more dominant (as shown in FIG. 5B). Therefore, as the memory array continues to grow taller due to advancements in memory array scaling, the peripheral circuitry needs to shrink in the x-y directions to fully take advantage of chip size scaling.

Additionally, due to the transition from triple-level cell (TLC) memory arrays to quad-level cell (QLC) memory arrays, the memory array 350 may shrink (e.g., by 33%). This scaling does not inherently extend to the peripheral circuitry, leading to the peripheral area becoming more dominant in the x-y directions (as shown in FIG. 5B). Therefore, as the memory array continues to shrink due to the shift from TLC to QLC (and beyond), the peripheral circuitry needs to shrink in the x-y directions to fully take advantage of chip size scaling.

FIG. 5B is a perspective view of a CUA memory structure 510 with a dominant peripheral area in accordance with some implementations. CuA structure 510 includes a memory array 512 and peripheral circuitry 514. Memory array 512 corresponds to memory array 502, but due to chip size scaling, the stack of memory cells is increased in the z direction compared to memory array 502, and the footprint is decreased in the x and y directions compared to memory array 502.

Peripheral circuitry 514 corresponds to peripheral circuitry 504. However, in order to manage the additional and/or denser array of memory cells in memory array 512, peripheral circuitry 514 requires additional x-y area compared to the x-y area required by memory array 512. To fully take advantage of chip size scaling, the peripheral circuitry 514 needs to shrink in the x-y directions. The discussion below with reference to FIGS. 6B and 8A-11B describes implementations of peripheral circuitry that optimize x-y area requirements.

One of the critical factors with regard to the x-y area requirement of peripheral circuitry includes the amount of area taken up by sense amplifier circuitry (e.g., sense blocks 370, FIG. 3). The purpose of sense amplifiers is to transform the analog voltages associated with memory cells to digital signals. Each bit line (e.g., bit lines 425, FIG. 4B) is coupled to a sense amplifier circuit, sometimes referred to as a tier in a sense amplifier stack. The sense amplifier stack extends in the y direction. The amount of space in the x direction taken up by the bit lines is sometimes referred to as bit line pitch.

FIG. 5C is a perspective view of a CUA memory structure 520 with a reduced peripheral area in accordance with some implementations. CuA structure 512 includes the memory array 512 described above with reference to FIG. 5B and peripheral circuitry 524 having a reduced footprint. As described above, memory array 512 corresponds to memory array 502, but due to chip size scaling, the stack of memory cells is increased in the z direction compared to memory array 502, and the footprint is decreased in the x and y directions compared to memory array 502.

Peripheral circuitry 524 corresponds to peripheral circuitry 504 and 514. However, by implementing the structures and mapping and control schemes described below with reference to FIGS. 6B and 8A-11B, the x-y area of peripheral circuitry 524 may be decreased compared to the area required for peripheral circuitry 504 and 514. The decreased x-y area of the peripheral circuitry 524 contributes to an overall reduced chip size.

Figure 6A:
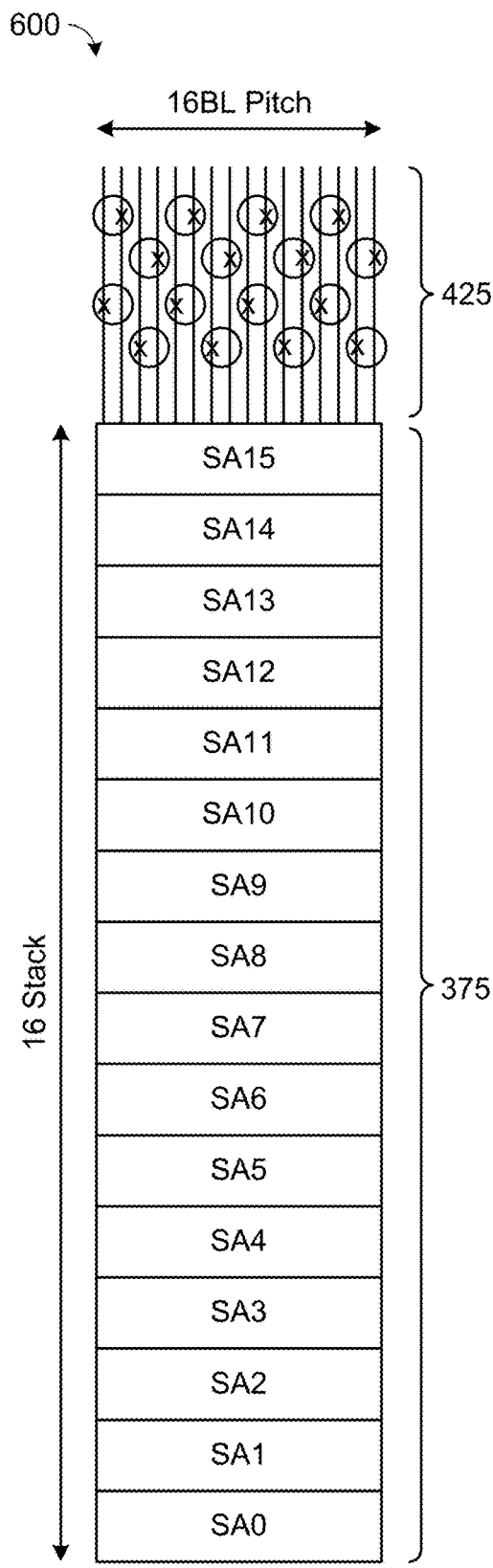
FIG. 6A is a block diagram of a 16-tier sense amplifier stack with 16 bit line pitch in accordance with some implementations.

FIG. 6A is a block diagram of a 16-tier sense amplifier stack (600) with 16 bit line pitch in accordance with some implementations. The sense amplifier stack in FIG. 6A includes 16 tiers (sometimes referred to as SA tiers), SA0 through SA15. Each SA tier is coupled to a bit line through a vertical column as described above with reference to bit lines 425 in FIGS. 4B and 4F. Each vertical column is denoted with a circle, and each connection is denoted with an X. The SA tiers extend in the x-y plane (see FIGS. 4B-4F and 5A-5C) while the bit lines are disposed in the y direction. The SA tiers correspond to sense amplifiers 375 (described above with reference to FIGS. 3 and 4F).

One way to shrink the amount of space required by the sense amplifier circuitry is to decrease the number of SA tiers in the stack.

Figure 6B:
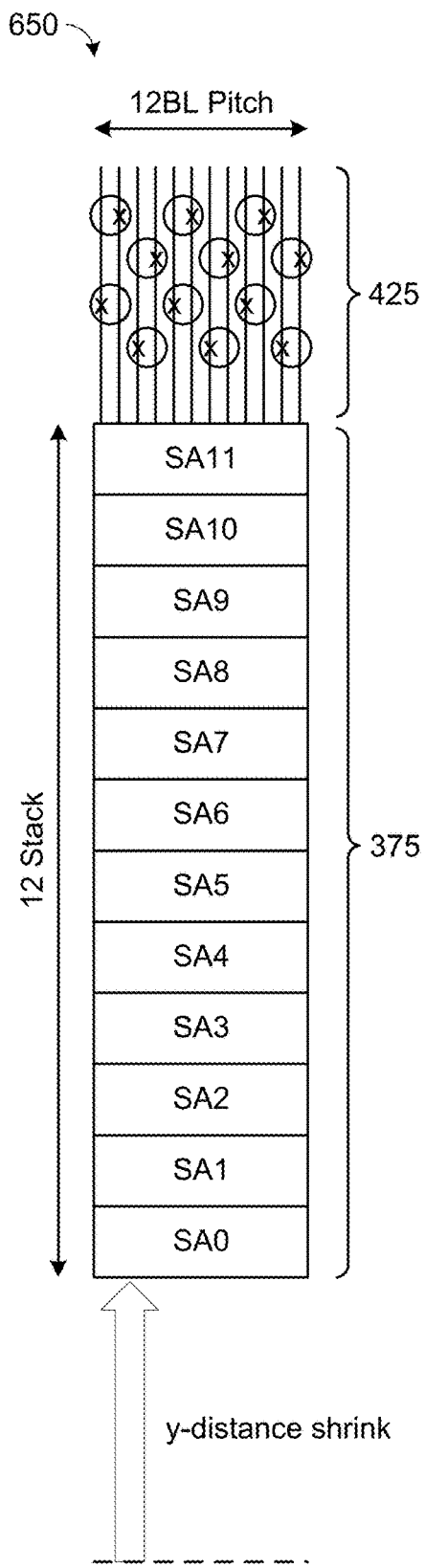
FIG. 6B is a block diagram of a 12-tier sense amplifier stack with 12 bit line pitch in accordance with some implementations.

FIG. 6B is a block diagram of a 12-tier sense amplifier stack (650) with 12 bit line pitch in accordance with some implementations. Compared to the 16-tier SA stack, the 12-tier SA stack includes 4 fewer SA tiers, resulting in a smaller area requirement in the y direction. In addition, since there are 4 fewer bit lines, the smaller bit line pitch (12BL versus 16BL) results in a smaller area requirement in the x direction.

By decreasing the number of SA tiers in a given SA stack, the x-y area is decreased as discussed above. However, this decrease in area may come at a cost in data routing complexity, especially if the storage medium 104 is configured to receive from the storage controller 102 or output to the storage controller 102 a number of bits of data that is a multiple of 8.

More specifically, each SA tier includes a sense amplifier data latch (sometimes referred to as an SADL) that is coupled to a corresponding latch circuit XDL in the I/O buffer 332 of the storage medium 104 (included in the peripheral circuitry 524). The latch circuits XDL (sometimes referred to herein simply as data latches) are used for cache operations, including temporary storage of data received from the storage controller 102 for writing to memory cells in the storage medium 104, and temporary storage of data read from the storage medium 104 for transfer to the storage controller 102. If the storage medium 104 is optimized for data transfer to/from the storage controller 102 in multiples of 8 bits, then a 12-tier SA stack introduces routing complexities as described with reference to FIGS. 7A-7B, 8A-8B, and 9A-8B below.

Figure 7A:
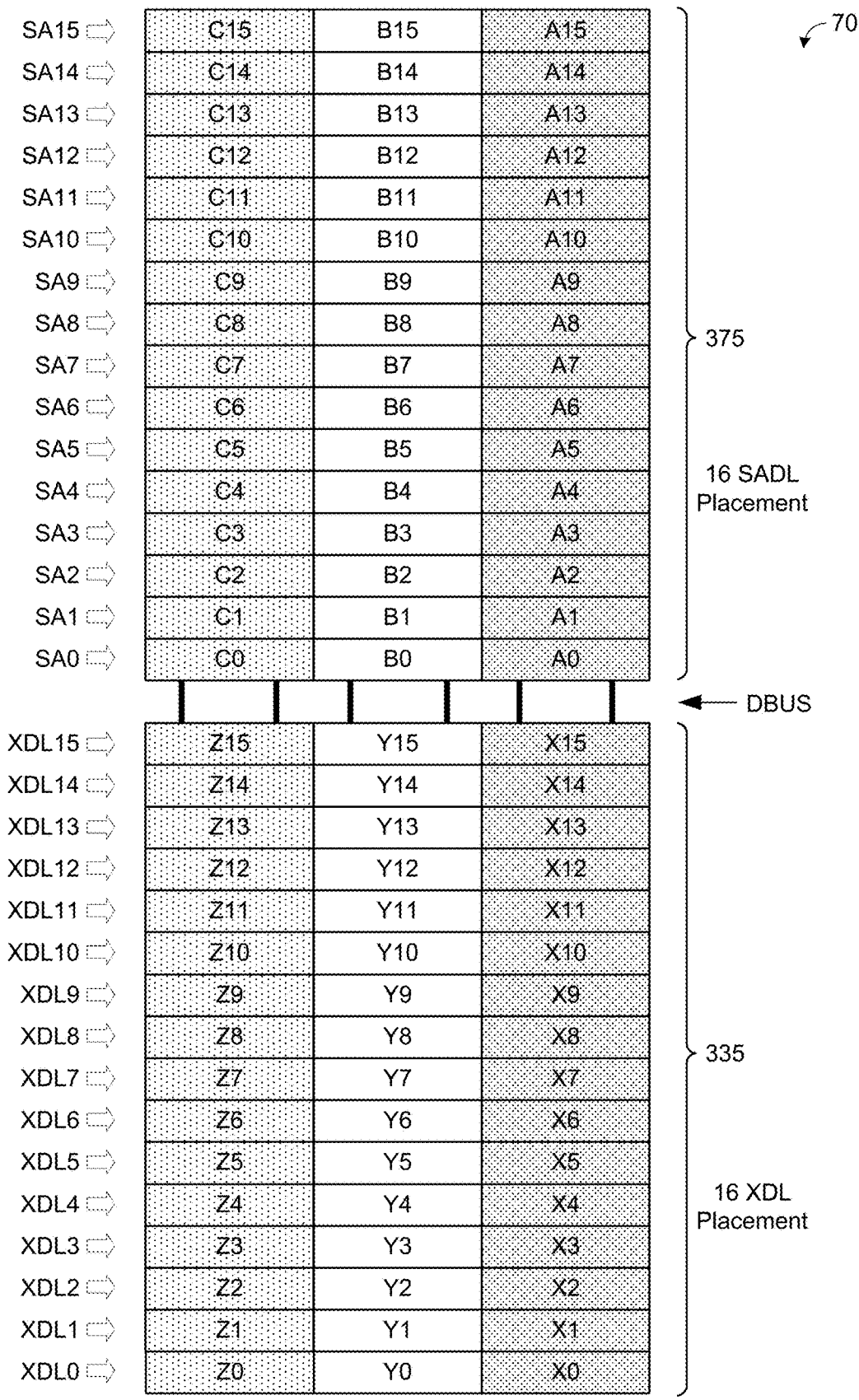
FIG. 7A is a block diagram of a 16-tier sense amplifier and 16-tier data latch structure in accordance with some implementations.

FIG. 7A is a block diagram of a 16-tier sense amplifier and 16-tier data latch structure 700 in accordance with some implementations. Each 16-tier SA stack corresponds to an SA stack 600 depicted in FIG. 6A (sense amplifiers 375, FIGS. 3 and 4F). The SA latches and XDL latches included in structure 700 may be implemented in peripheral circuitry 514. While the example depicted in FIG. 7A includes three SA/XDL stacks, it is understood that peripheral circuitry may include more than three groups or less than three groups. Since the number of SA tiers equals the number of XDL tiers, the routing of data between corresponding SA and XDL tiers is relatively straightforward (as discussed in detail below with reference to FIG. 7B).

A data latch SADL in each SA tier is coupled to a corresponding data latch XDL in the I/O buffer 332, from which data read from the memory array 512 via bit lines 425 is transferred to the storage controller 102, or to which data for writing to the memory array 512 via bit lines 425 is transferred from the storage controller 102. Data is transferred between SA latches and XDL latches using a plurality of data bus lines (sometimes referred to as DBUS lines, data path lines, the DBUS, or the data path).

The peripheral circuitry 514 includes a plurality of SA groups per plane (e.g., enough to process up to 16 kB or more). Each SA group consists of a sense amplifier and multiple sense-amplifier data latches (SADLs). These SADLs are connected to the cache data latches (XDLs) and are placed next to the SA groups by bus lines (DBUS). The total parasitic capacitance of the DBUS is large and so the peak current will be large if all DBUS lines are pre-charged simultaneously before transferring the data. As such, the data transfer between SA latches and XDL latches via DBUS may be divided into a plurality of cycles (e.g., 8 cycles or 16 cycles) to disperse the peak current. Dispersing the peak current in such a manner comes at the cost of throughput. Therefore, the number of cycles may be chosen to optimize the tradeoff between reducing the data transfer time and suppressing the peak current.

Referring to the DBUS in structure 700, DBUS lines connect SA circuits A0-A15 (corresponding to SA tiers SA0-SA15) to XDL circuits X0-X15 (corresponding to XDL tiers XDL0-XDL15), respectively. Similarly, DBUS lines connect SA circuits B0-B15 (corresponding to SA tiers SA0-SA15) to XDL circuits Y0-Y15 (corresponding to XDL tiers XDL0-XDL15), respectively. Lastly, DBUS lines connect SA circuits C0-C15 (corresponding to SA tiers SA0-SA15) to XDL circuits Z0-Z15 (corresponding to XDL tiers XDL0-XDL15), respectively. For example, data read from the memory array 512 that is processed by SA circuit B11 is transferred to XDL circuit Y11 in the I/O buffer 332 via a DBUS line, where it is held until it can be transferred to the storage controller 102.

Figure 7B:
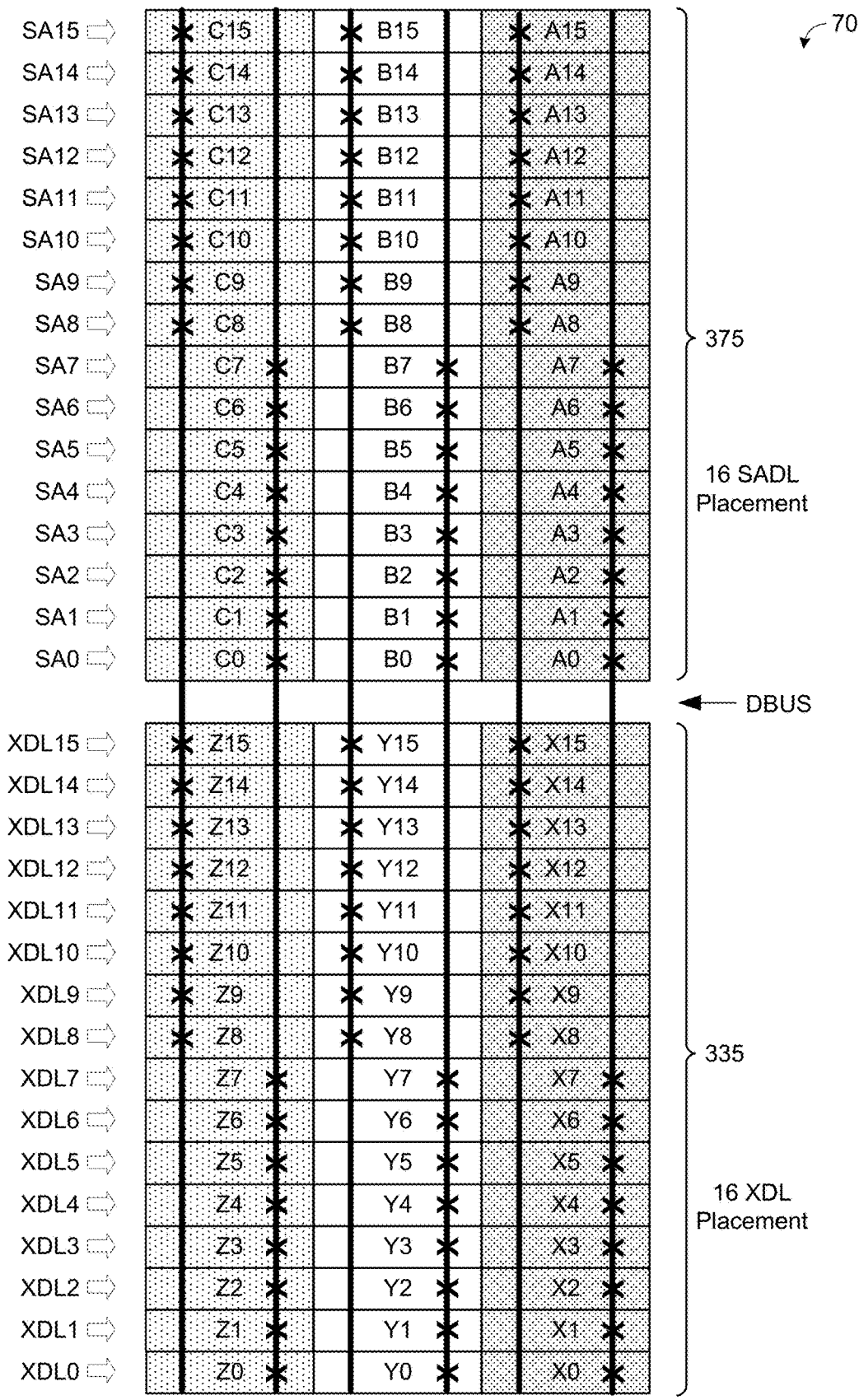
FIG. 7B is a block diagram of a 16-tier sense amplifier and 16-tier data latch structure with data bus connections in accordance with some implementations.

FIG. 7B is a block diagram of the 16-tier sense amplifier and 16-tier data latch structure 700 depicted in FIG. 7A, with individual DBUS connections in accordance with some implementations. Each connection is denoted with an X. Each DBUS line connects 8 SA latches to 8 XDL latches. In this example:

SA latches A0-A7 are coupled to XDL latches X0-X7,
SA latches A8-A15 are coupled to XDL latches X8-X15,
SA latches B0-BA7 are coupled to XDL latches Y0-YX7,
SA latches B8-B15 are coupled to XDL latches Y8-Y15,
SA latches C0-C7 are coupled to XDL latches Z0-Z7, and
SA latches C8-C15 are coupled to XDL latches Z8-Z15.

During data transfer operations (e.g., read and write), each DBUS line transfers one bit at a time between an SA latch and an XDL latch. As a result, for every group of three 16-tier XDL stacks, 6 bits are transferred at a time. For example, bits at SA latches A0, A8, B0, B8, C0, and C8 are simultaneously transferred to XDL latches X0, X8, Y0, Y8, Z0, and Z8, respectively. Subsequently, bits at SA latches A1, A9, B1, B9, C1, and C9 are simultaneously transferred to XDL latches X1, X9, Y1, Y9, Z1, and Z9, respectively, and so forth.

The above example represents 8 transfer cycles, with each cycle transferring 6 bits of data. In some implementations, there may be more cycles (e.g., 16 cycles, one for each latch in an XDL stack) or fewer cycles (e.g., 4 cycles, one for every 4 latches in an XDL stack). The exact number of cycles may be chosen to optimize peak current as described above.

Figure 8A:
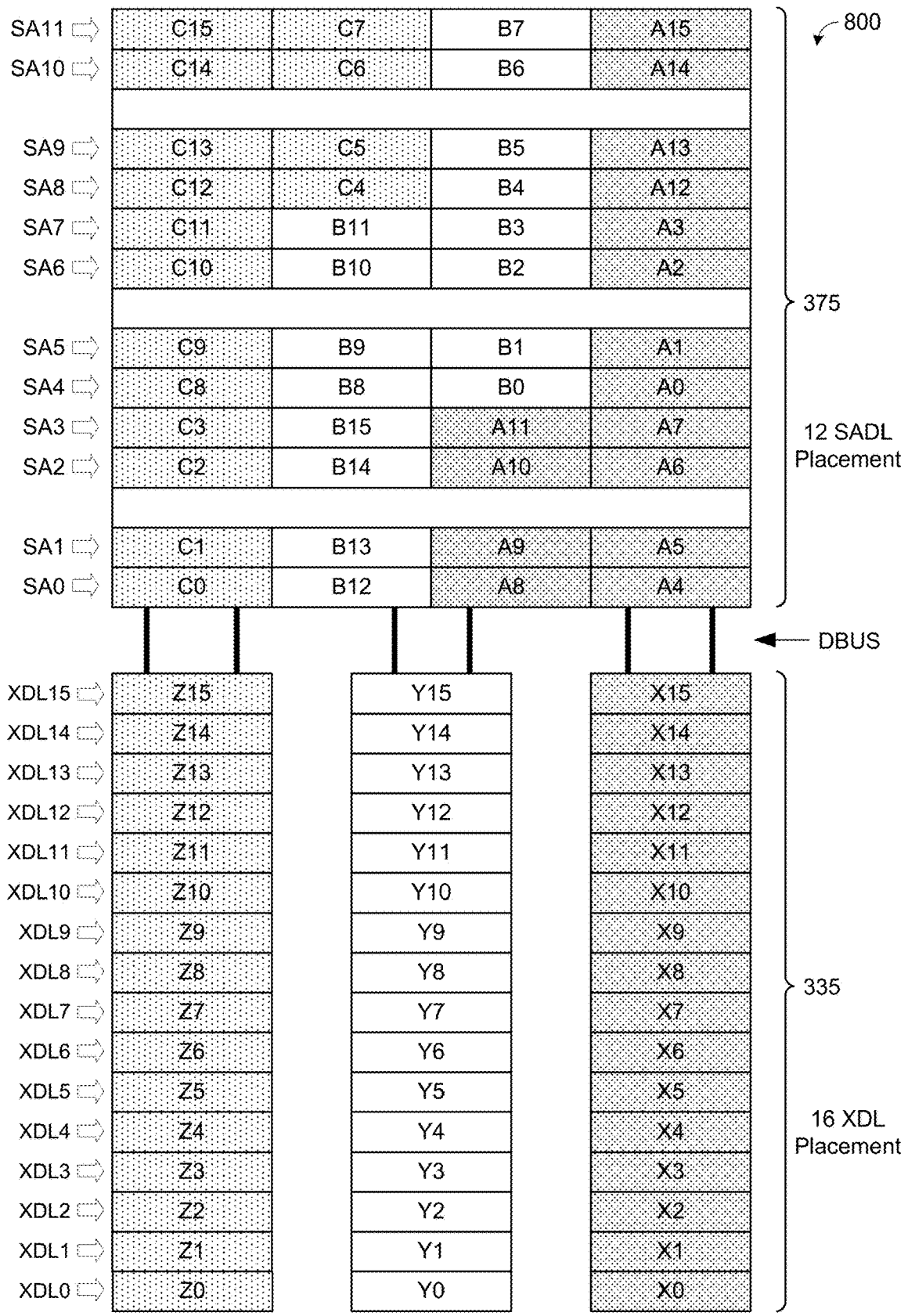
FIG. 8A is a block diagram of a 12-tier sense amplifier and 16-tier data latch structure in accordance with some implementations.

FIG. 8A is a block diagram of a 12-tier sense amplifier and 16-tier data latch structure 800 in accordance with some implementations. Each 12-tier SA stack corresponds to an SA stack 650 depicted in FIG. 6B (sense amplifiers 375 in FIGS. 3 and 4F). In some implementations, bit line hookup (BLHU) areas may be disposed between one or more of the SA tiers. In structure 800, there are three BLHU areas (between SA1-2, SA5-6, and SA9-10). Alternative BLHU layouts may be implemented. For example, structures 900 and 1000 in FIGS. 9A-9B and 10A-10B include two BLHU areas (between SA2-3 and SA8-9).

The SA latches and XDL latches included in structure 800 may be implemented in peripheral circuitry 524. While the example depicted in FIG. 8A includes four SA stacks and three XDL stacks, it is understood that peripheral circuitry may include more than four SA stacks, less than four SA stacks, more than three XDL stacks, or less than three XDL stacks. However, as will be explained in detail below, by maintaining a ratio of 4 SA stacks to 3 XDL stacks, DBUS routing may be optimized.

As described above, reduction of 16 to 12 SA tiers may contribute to less area required in the y direction (see FIG. 6B, y-height shrink) and smaller bit line pitch (see FIG. 6B, 12BL pitch). However, if the storage controller 102 and storage medium 104 are configured to transfer data in multiples of 8 (e.g., 8 bits or 16 bits of input/output at the interface 330), each XDL stack will still require a number of tiers that is a multiple of 8. For example, to transfer 16 bits of data, each XDL stack still requires 16 tiers, as described above with reference to FIGS. 7A-7B.

Since the number of SA tiers (12) does not equal the number of XDL tiers (16), the routing of data between corresponding SA and XDL latches is relatively complex compared to the routing of data described above with reference to FIGS. 7A-7B. In order to connect 12 tiers of SA circuitry to 16 tiers of XDL circuitry, while still fully utilizing each DBUS, there can no longer be a 1:1 ratio of SA to XDL groups.

In order to optimize the DBUS connections between SA groups having a first number of tiers and XDL groups having a second number of tiers unequal to the first number of tiers, a plurality of SA groups may be coupled to a second plurality of XDL groups, wherein the first plurality is not necessarily equal to the second plurality. The number of SA groups in the first plurality, and the number of XDL groups in the second plurality may be based on the least common multiple (LCM) of the number of SA tiers and the number of XDL tiers.

For example, to connect a plurality of 12-tier stacks of SA latches to a plurality of 16-tier stacks of XDL latches, the LCM is first determined (48). The number of SA groups in the first plurality is equal to the LCM divided by the number of tiers in each SA group (48/12=4), and the number of XDL groups in the second plurality is equal to the LCM divided by the number of tiers in each XDL group (48/16=3). As such, by connecting every 4 groups of SA latches to 3 groups of XDL latches, the DBUS lines (and thus the data transfer rate) may be fully optimized.

A data latch SADL in each SA tier is coupled to a corresponding data latch XDL in the I/O buffer 332, from which data read from the memory array 512 via bit lines 425 is transferred to the storage controller 102, or to which data for writing to the memory array 512 via bit lines 425 is transferred from the storage controller 102. Data is transferred between SA latches and XDL latches using a plurality of data bus lines (sometimes referred to as DBUS lines, data path lines, the DBUS, or the data path).

The peripheral circuitry 524 includes a plurality of SA groups per plane (e.g., enough to process up to 16 kB or more). Each SA group consists of a sense amplifier and multiple sense-amplifier data latches (SADLs). These SADLs are connected to the cache data latches (XDLs) and are placed next to the SA groups by bus lines (DBUS). The total parasitic capacitance of the DBUS is large and so the peak current will be large if all DBUS lines are pre-charged simultaneously before transferring the data. As such, the data transfer between SA latches and XDL latches via DBUS may be divided into a plurality of cycles (e.g., 8 cycles or 16 cycles) to disperse the peak current. Dispersing the peak current in such a manner comes at the cost of throughput. Therefore, the number of cycles may be chosen to optimize the tradeoff between reducing the data transfer time and suppressing the peak current.

In structure 800, a first group of 16 XDL latches X0-X15, a second group of 16 XDL latches Y0-Y15, and a third group of 16 XDL latches Z0-Z15 is coupled to a first group of 12 SA latches A0-7 and A12-15, a second group of 12 SA latches A8-11 and B0-7, a third group of 12 SA latches B8-15 and C4-7, and a fourth group of 12 SA latches C0-3 and C8-15. Each group of 16 XDL latches corresponds to latch tiers XDL0-XDL15, and each group of SA latches corresponds to SA tiers SA0-SA11 as depicted in the figure.

From the perspective of the data latch XDL groups, each group of 16 XDL latches connects to 16 SA latches included in two SA groups. For example, XDL latches X0-15 connect to SA latches A0-7 and A12-15 in a first SA group and SA latches A8-11 in a second SA group.

From the perspective of the sense amplifier SA groups, each group of 12 SA latches connects to a first plurality of XDL latches in a first XDL group and a second plurality of XDL latches in a second XDL group, wherein the first plurality is between 0 and 12, the second plurality is between 0 and 12, and the first and second pluralities add up to 12.

For example, the first group of SA latches (A0-A7 and A12-15) connects to 12 XDL latches in the first XDL group (the X group), the second group of SA latches (A8-A11 and B0-B7) connects to 4 XDL latches in the first XDL group (the X group) and 8 XDL latches in the second XDL group (the Y group), the third group of SA latches (B8-B15 and C4-C7) connects to 8 XDL latches in the second XDL group (the Y group) and 4 XDL latches in the third XDL group (the Z group), and the fourth group of SA latches (C0-C3 and C8-C15) connects to 12 XDL latches in the third XDL group (the Z group).

Figure 8B:
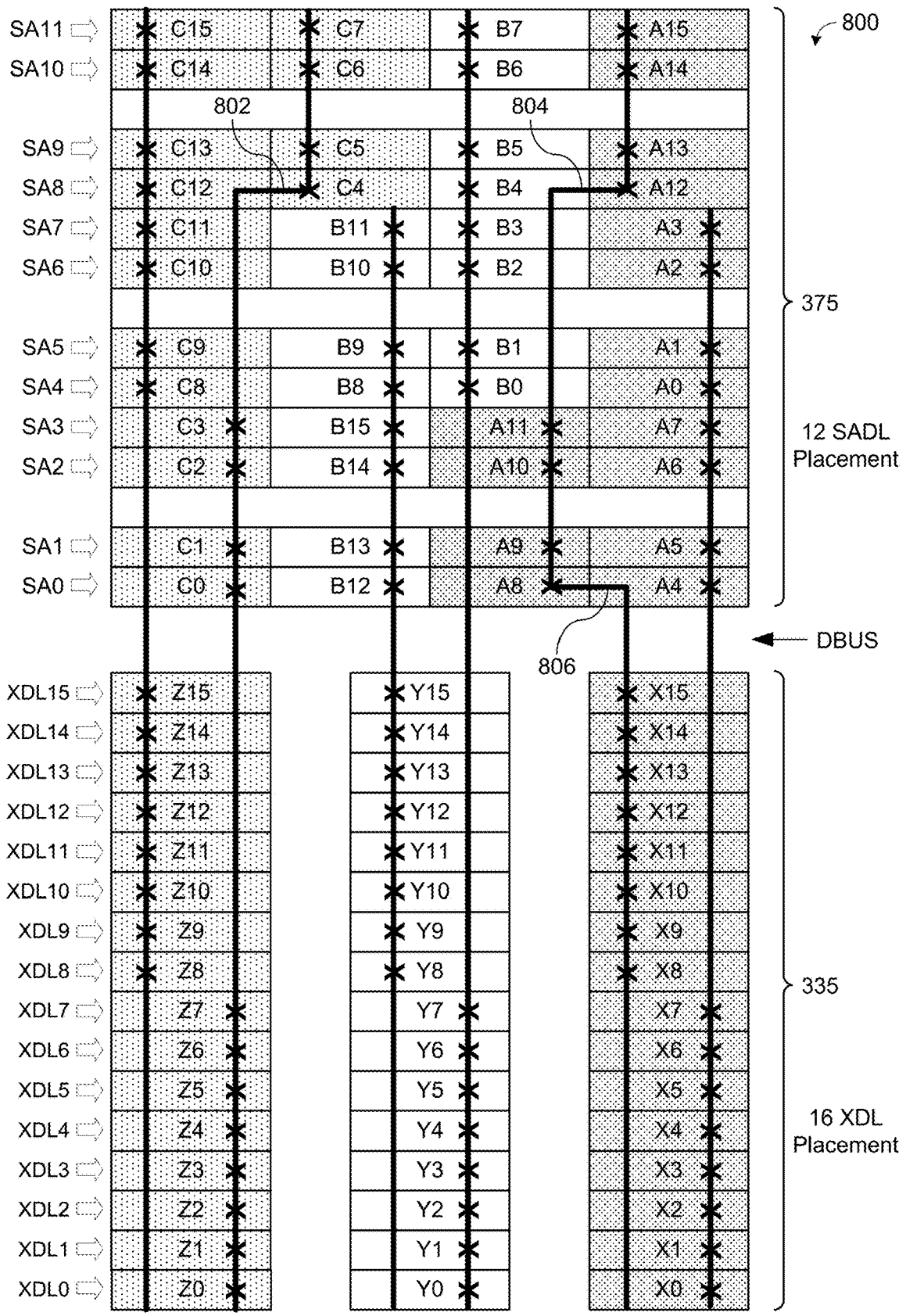
FIG. 8B is a block diagram of a 12-tier sense amplifier and 16-tier data latch structure with data bus connections in accordance with some implementations.

FIG. 8B is a block diagram of the 12-tier sense amplifier and 16-tier data latch structure 800 depicted in FIG. 8A, with individual DBUS connections in accordance with some implementations. Each connection is denoted with an X. Each DBUS line connects 8 SA latches to 8 XDL latches. In this example:

SA latches A0-A7 are coupled to XDL latches X0-X7,
SA latches A8-A15 are coupled to XDL latches X8-X15,
SA latches B0-BA7 are coupled to XDL latches Y0-YX7,
SA latches B8-B15 are coupled to XDL latches Y8-Y15,
SA latches C0-C7 are coupled to XDL latches Z0-Z7, and
SA latches C8-C15 are coupled to XDL latches Z8-Z15.

In contrast to structure 700 (FIG. 7B), the SA latches that are coupled to a given stack of XDL latches may be spread out over two different stacks of SA latches. For example, while SA latches A0-A15 are coupled to a first stack of XDL latches (X0-X15), 12 of those SA latches (A0-A7 and A12-A15) are in a first stack of SA latches, and 4 of those latches (A8-A11) are in a second stack of SA latches. In order to couple latches from two SA stacks to latches in one XDL stack, the DBUS lines may include one or more bridges (e.g., 802, 804, 806) that extend from one SA stack to a neighboring SA stack.

During data transfer operations (e.g., read and write), each DBUS line transfers one bit at a time between an SA latch and an XDL latch. As a result, for every group of three 16-tier XDL stacks, 6 bits are transferred at a time. For example, bits at SA latches A0, A8, B0, B8, C0, and C8 are simultaneously transferred to XDL latches X0, X8, Y0, Y8, Z0, and Z8, respectively. Subsequently, bits at SA latches A1, A9, B1, B9, C1, and C9 are simultaneously transferred to XDL latches X1, X9, Y1, Y9, Z1, and Z9, respectively, and so forth.

The above example represents 8 transfer cycles, with each cycle transferring 6 bits of data. In some implementations, there may be more cycles (e.g., 16 cycles, one for each latch in an XDL stack) or fewer cycles (e.g., 4 cycles, one for every 4 latches in an XDL stack). The exact number of cycles may be chosen to optimize peak current as described above.

In structure 800, the top 4 tiers (SA8-SA11) include 4 DBUS lines, the bottom 8 tiers (SA0-7) include 6 DBUS lines, and there are 3 bridges (802, 804, and 806). This implementation is just one example routing scheme for connecting 12 SA tiers to 16 XDL tiers. Other schemes may implement different numbers of DBUS line across different SA tiers by using a different number of bridges. One such example is described below with reference to FIGS. 9A-9B.

Figure 9A:
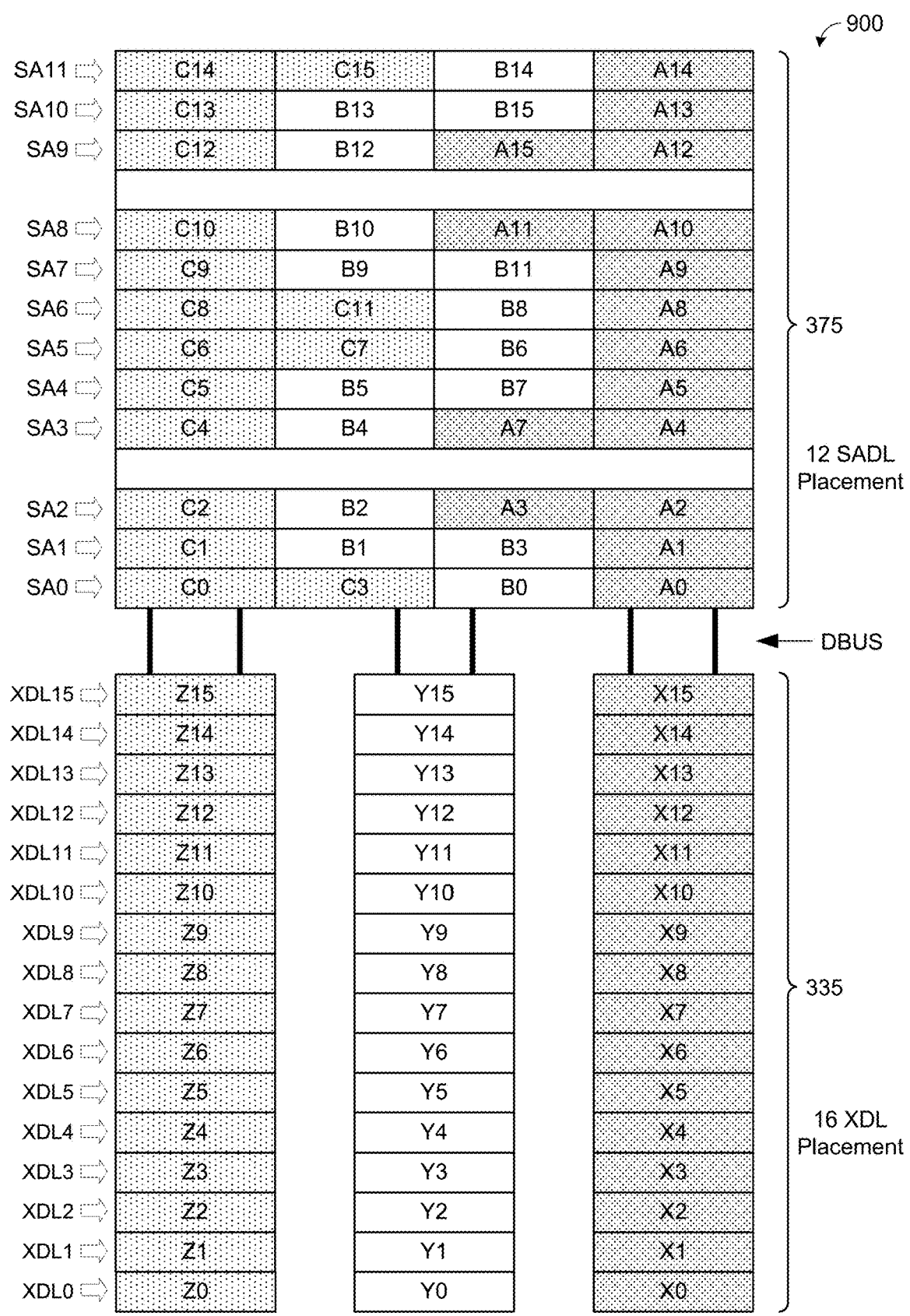
FIG. 9A is a block diagram of a 12-tier sense amplifier and 16-tier data latch structure in accordance with some implementations.

FIG. 9A is a block diagram of a 12-tier sense amplifier and 16-tier data latch structure 900 in accordance with some implementations. Each 12-tier SA stack corresponds to an SA stack 650 depicted in FIG. 6B (sense amplifiers 375 in FIGS. 3 and 4F). In some implementations, bit line hookup (BLHU) areas may be disposed between one or more of the SA tiers. In structure 800, there are two BLHU areas (between SA2-3 and SA8-9). As described above, alternative BLHU layouts may be implemented.

The SA latches and XDL latches included in structure 900 may be implemented in peripheral circuitry 524. While the example depicted in FIG. 9A includes four SA stacks and three XDL stacks, it is understood that peripheral circuitry may include more than four SA stacks, less than four SA stacks, more than three XDL stacks, or less than three XDL stacks. However, as will be explained in detail below, by maintaining a ratio of 4 SA stacks to 3 XDL stacks, DBUS routing may be optimized.

As described above with reference to FIGS. 8A-8B, in order to optimize the DBUS connections between SA groups having a first number of tiers and XDL groups having a second number of tiers unequal to the first number of tiers, a plurality of SA groups may be coupled to a second plurality of XDL groups, wherein the first plurality is not necessarily equal to the second plurality. The number of SA groups in the first plurality, and the number of XDL groups in the second plurality may be based on the least common multiple (LCM) of the number of SA tiers and the number of XDL tiers.

For example, to connect a plurality of 12-tier stacks of SA latches to a plurality of 16-tier stacks of XDL latches, the LCM is first determined (48). The number of SA groups in the first plurality is equal to the LCM divided by the number of tiers in each SA group (48/12=4), and the number of XDL groups in the second plurality is equal to the LCM divided by the number of tiers in each XDL group (48/16=3). As such, by connecting every 4 groups of SA latches to 3 groups of XDL latches, the DBUS lines (and thus the data transfer rate) may be fully optimized.

A data latch SADL in each SA tier is coupled to a corresponding data latch XDL in the I/O buffer 332, from which data read from the memory array 512 via bit lines 425 is transferred to the storage controller 102, or to which data for writing to the memory array 512 via bit lines 425 is transferred from the storage controller 102. Data is transferred between SA latches and XDL latches using a plurality of data bus lines (sometimes referred to as DBUS lines, data path lines, the DBUS, or the data path).

In structure 900, a first group of 16 XDL latches X0-X15, a second group of 16 XDL latches Y0-Y15, and a third group of 16 XDL latches Z0-Z15 are coupled to a first group of 12 SA latches A0-2, A4-6, A8-10, and A12-14; a second group of 12 SA latches B0, B3, A3, A7, B6-8, B11, A11, A15, B14, and B15; a third group of 12 SA latches C3, B1, B2, B4, B5, C7, C11, B9, B10, B12, B13, and C15; and a fourth group of 12 SA latches C0-2, C4-6, C8-10, and C12-14. Each group of 16 XDL latches corresponds to latch tiers XDL0-XDL15, and each group of SA latches corresponds to SA tiers SA0-SA11 as depicted in the figure.

From the perspective of the data latch XDL groups, each group of 16 XDL latches connects to 16 SA latches included in two SA groups. For example, XDL latches X0-15 connect to SA latches A0-2, A4-6, A8-10, and A12-14 in a first SA group and SA latches A3, A7, A11, and A15 in a second SA group.

From the perspective of the sense amplifier SA groups, each group of 12 SA latches connects to a first plurality of XDL latches in a first XDL group and a second plurality of XDL latches in a second XDL group, wherein the first plurality is between 0 and 12, the second plurality is between 0 and 12, and the first and second pluralities add up to 12.

For example, the first group of SA latches (A0-2, A4-6, A8-10, and A12-14) connects to 12 XDL latches in the first XDL group (the X group), the second group of SA latches (B0, B3, A3, A7, B6-8, B11, A11, A15, B14, and B15) connects to 4 XDL latches in the first XDL group (the X group) and 8 XDL latches in the second XDL group (the Y group), the third group of SA latches (C3, B1, B2, B4, B5, C7, C11, B9, B10, B12, B13, and C15) connects to 8 XDL latches in the second XDL group (the Y group) and 4 XDL latches in the third XDL group (the Z group), and the fourth group of SA latches (C0-2, C4-6, C8-10, and C12-14) connects to 12 XDL latches in the third XDL group (the Z group).

Figure 9B:
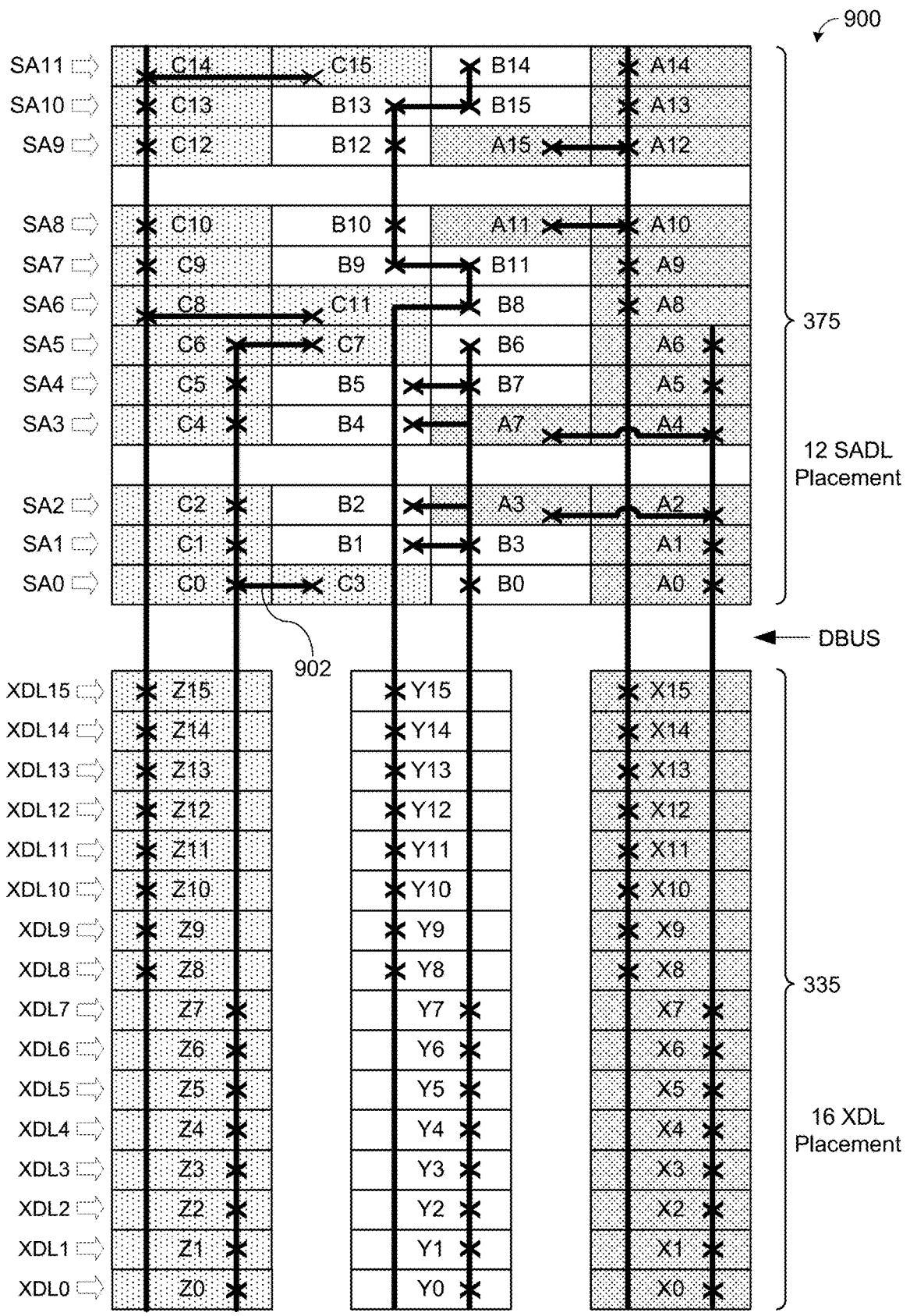
FIG. 9B is a block diagram of a 12-tier sense amplifier and 16-tier data latch structure with data bus connections in accordance with some implementations.

FIG. 9B is a block diagram of the 12-tier sense amplifier and 16-tier data latch structure 900 depicted in FIG. 9A, with individual DBUS connections in accordance with some implementations. Each connection is denoted with an X. Each DBUS line connects 8 SA latches to 8 XDL latches. In this example:
SA latches A0-A7 are coupled to XDL latches X0-X7,
SA latches A8-A15 are coupled to XDL latches X8-X15,
SA latches B0-BA7 are coupled to XDL latches Y0-YX7,
SA latches B8-B15 are coupled to XDL latches Y8-Y15,
SA latches C0-C7 are coupled to XDL latches Z0-Z7, and
SA latches C8-C15 are coupled to XDL latches Z8-Z15.

In contrast to structure 700 (FIG. 7B), the SA latches that are coupled to a given stack of XDL latches may be spread out over two different stacks of SA latches. For example, while SA latches A0-A15 are coupled to a first stack of XDL latches (X0-X15), 12 of those SA latches (A0-A2, A4-A6, A8-A10, and A12-A14) are in a first stack of SA latches, and 4 of those latches (A3, A7, A11, and A15) are in a second stack of SA latches. In order to couple latches from two SA stacks to latches in one XDL stack, the DBUS lines may include one or more bridges (e.g., 902) that extend from one SA stack to a neighboring SA stack.

During data transfer operations (e.g., read and write), each DBUS line transfers one bit at a time between an SA latch and an XDL latch. As a result, for every group of three 16-tier XDL stacks, 6 bits are transferred at a time. For example, bits at SA latches A0, A8, B0, B8, C0, and C8 are simultaneously transferred to XDL latches X0, X8, Y0, Y8, Z0, and Z8, respectively. Subsequently, bits at SA latches A1, A9, B1, B9, C1, and C9 are simultaneously transferred to XDL latches X1, X9, Y1, Y9, Z1, and Z9, respectively, and so forth.

The above example represents 8 transfer cycles, with each cycle transferring 6 bits of data. In some implementations, there may be more cycles (e.g., 16 cycles, one for each latch in an XDL stack) or fewer cycles (e.g., 4 cycles, one for every 4 latches in an XDL stack). The exact number of cycles may be chosen to optimize peak current as described above.

In comparison to structure 800 (FIG. 8B), the alternative mapping scheme in structure 900 includes different combinations of DBUS lines throughout the SA groups and more bridges. The specific mapping topology may be chosen to optimize the additional cost of extra DBUS routing (e.g., number of bridges) with efficiencies introduced by grouping successive SA latches (e.g., B0-B3) closer together.

Figure 10A:
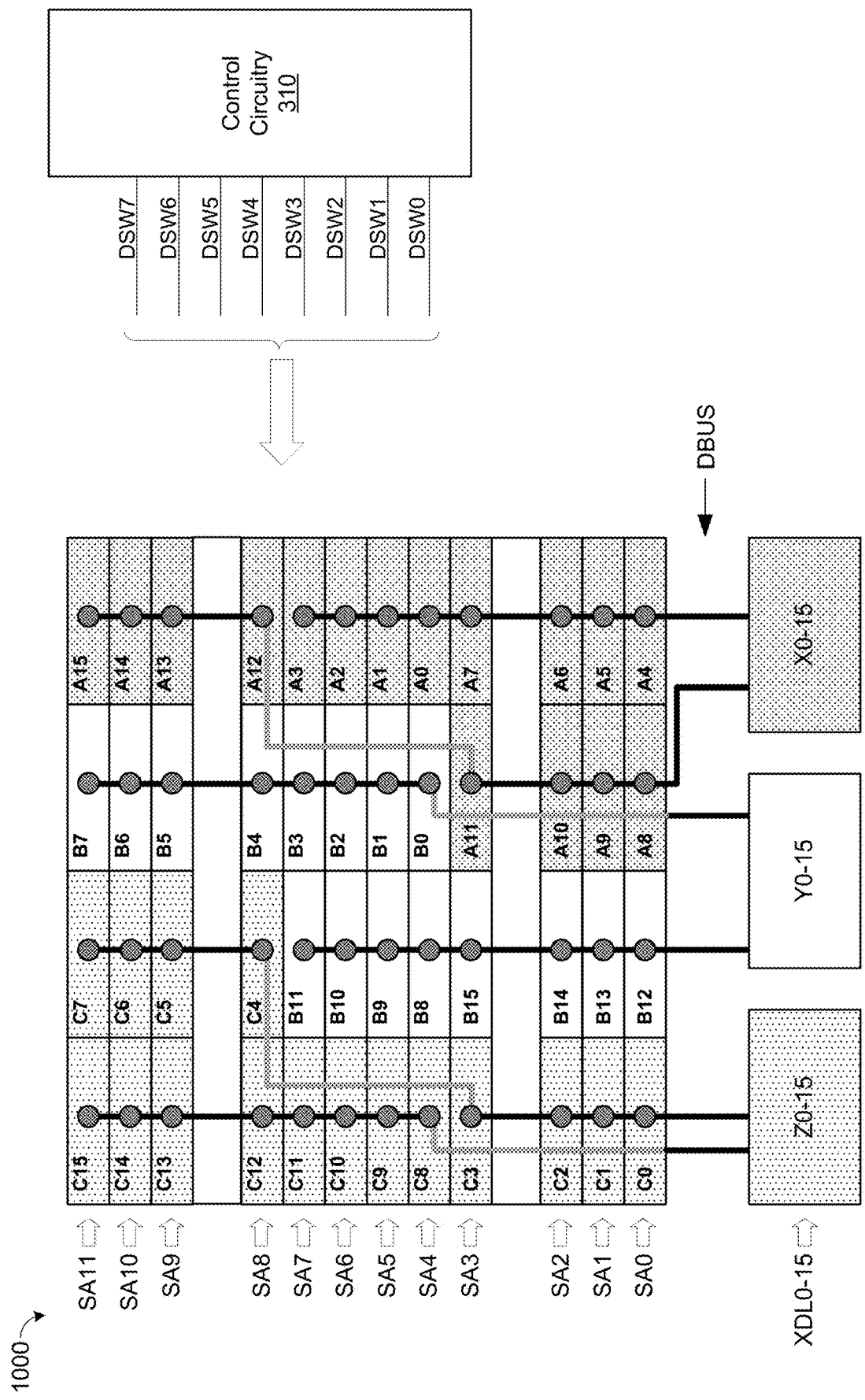
FIG. 10A is a block diagram of a 12-tier sense amplifier and 16-tier data latch structure in accordance with some implementations.

FIG. 10A is a block diagram of a 12-tier sense amplifier and 16-tier data latch structure 1000 in accordance with some implementations. Structure 1000 corresponds to structure 800 in FIGS. 8A-8B. Control circuitry 310 controls the transferring of data between SA latches and corresponding XDL latches. Control circuitry 310 includes 8 control lines DSW0 through DSW7. The 8 control lines correspond to the 8 data transfer cycles described above with reference to FIGS. 8A-8B.

For each data transfer cycle, one of the control lines is asserted, thereby causing 6 bits to be transferred (1 bit between each of 6 XDL latches and 6 corresponding SA latches). Specifically, each control line causes data to be transferred between:
  two XDL latches in a first group of XDL latches (the X group) and two corresponding SA latches,
  two XDL latches in a second group of XDL latches (the Y group) and two corresponding SA latches, and
  two XDL latches in a third group of XDL latches (the Z group) and two corresponding SA latches.

Control circuitry 310 uses 8 control lines due to each stack of 16 XDL latches being able to transfer 2 bits at a time for each transfer cycle. As such, assertion of a given control line causes 2 bits to be transferred to or from each XDL stack. However, since the control lines are connected to SA latches, and the number of SA latches in each group is not a multiple of the number of control lines, the routing of control lines to SA latches is not straightforward. Instead, at least a portion of the SA tiers are double routed, meaning two control lines are disposed throughout those tiers, rather than one control line per tier.

Figure 10B:
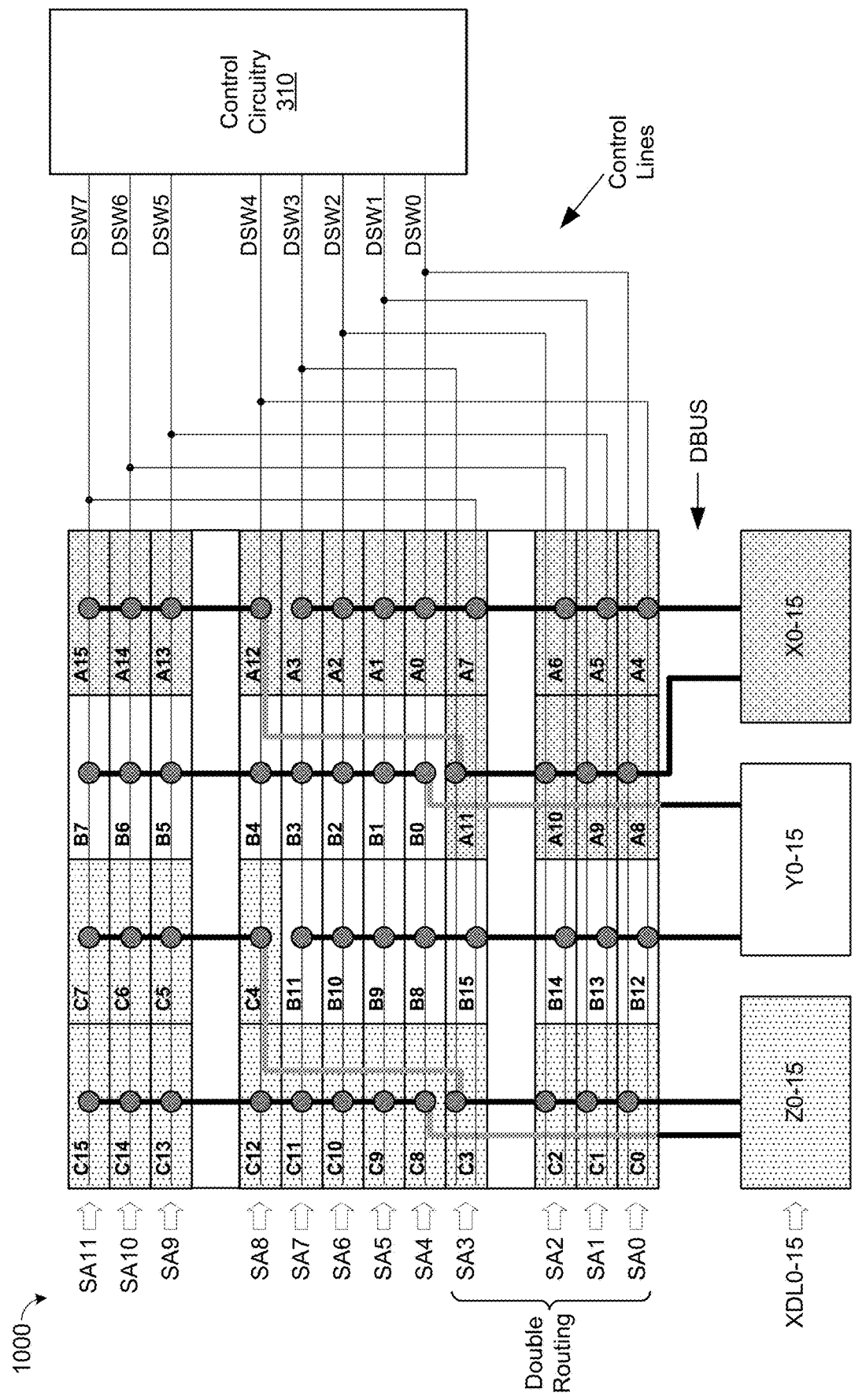
FIG. 10B is a block diagram of a 12-tier sense amplifier and 16-tier data latch structure with control connections in accordance with some implementations.

FIG. 10B is a block diagram of the 12-tier sense amplifier and 16-tier data latch structure 1000 depicted in FIG. 10A, with control connections in accordance with some implementations. Each control line DSW0-7 is routed to two SA tiers. As a result, the assertion of a given control line causes the bits in the two corresponding tiers for one or more of the SA latches in those tiers to be transferred to corresponding XDL latches.

More specifically, each control line (e.g., DSW0) is routed to a first SA tier (e.g., SA0) and a second SA tier (e.g., SA4). The portion of the particular control line routed to the first SA tier is connected to a subset less than all of the SA latches in that tier (e.g., C0 and A8), and the portion of the control line routed to the second SA tier is connected to all of the SA latches in that tier (e.g., C8, B8, B0, and A0). During operation, assertion of the particular control line causes the 6 SA latches (e.g., A0, B0, C0, A8, B8, and C8) to be routed to corresponding data latches (e.g., X0, Y0, Z0, X8, Y8, and Z8 as shown in FIG. 8B).

Implementing the control line routing scheme described above, each control line causes data in 6 SA latches to be transferred as follows:
  control line DSW0 transfers data in a first subset of two of latches in tier SA0, and all four latches in tier SA4;
  control line DSW1 transfers data in a second subset of two of latches in tier SA0, and all four latches in tier SA5;
  control line DSW2 transfers data in a first subset of two of latches in tier SA1, and all four latches in tier SA6;
  control line DSW3 transfers data in a second subset of two of latches in tier SA1, and all four latches in tier SA7;
  control line DSW4 transfers data in a first subset of two of latches in tier SA2, and all four latches in tier SA8;
  control line DSW5 transfers data in a second subset of two of latches in tier SA2, and all four latches in tier SA9;
  control line DSW6 transfers data in a first subset of two of latches in tier SA3, and all four latches in tier SA10; and
  control line DSW7 transfers data in a second subset of two of latches in tier SA3, and all four latches in tier SA11.

From the perspective of the SA latches, each tier in a first subset of SA tiers (SA0-3) is selectively connected to a first control line for transferring data in two of the four latches of the SA tier, and a second control line for transferring data in the other two of the four latches of the SA tier. Each tier in a second subset of SA tiers (SA4-11) is connected to a single control line for transferring data in all four latches of the SA tier.

As a result of the control line routing scheme described above, a 12-tier SA stack may be controlled using 8 control lines to transfer data between (i) 4 groups of 12 tiers of SA latches, and (ii) 3 groups of 16 tiers of XDL latches. While the above discussion describes 12-tier SA stacks and 16-tier XDL stacks, the mapping (FIG. 8B) and control routing (FIG. 10B) concepts may be applied to other unequal tier combinations of SA stacks and XDL stacks in peripheral circuitry 524. As a result of such mapping and control routing concepts, the peripheral circuitry 524 may be implemented using less x-y area, thereby optimizing chip size.

Figure 11A:
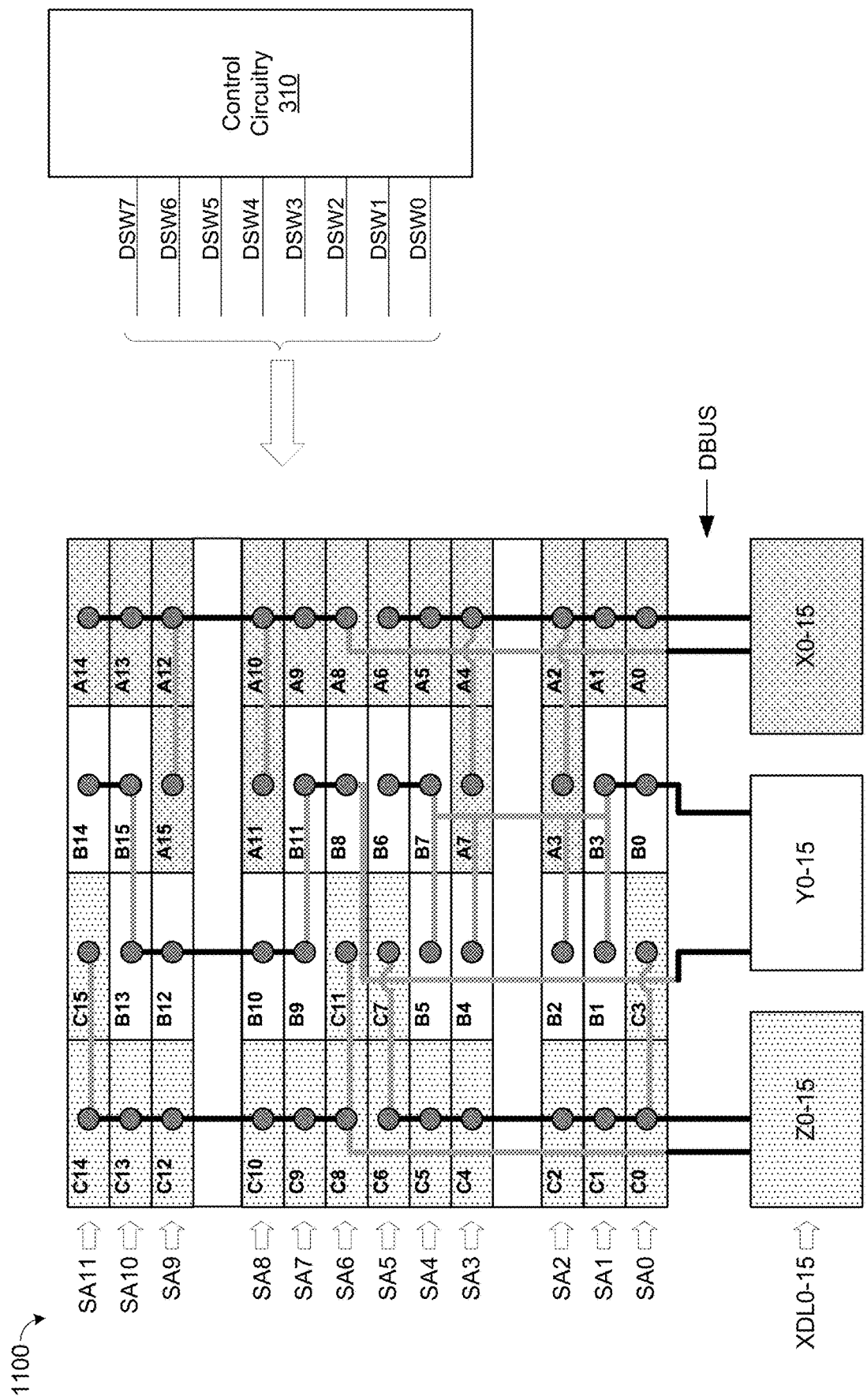
FIG. 11A is a block diagram of a 12-tier sense amplifier and 16-tier data latch structure in accordance with some implementations.

FIG. 11A is a block diagram of a 12-tier sense amplifier and 16-tier data latch structure 1100 in accordance with some implementations. Structure 1100 corresponds to structure 900 in FIGS. 9A-9B. Control circuitry 310 controls the transferring of data between SA latches and corresponding XDL latches. Control circuitry 310 includes 8 control lines DSW0 through DSW7. The 8 control lines correspond to the 8 data transfer cycles described above with reference to FIGS. 9A-9B.

For each data transfer cycle, one of the control lines is asserted, thereby causing 6 bits to be transferred (1 bit between each of 6 XDL latches and 6 corresponding SA latches). Specifically, each control line causes data to be transferred between:
  two XDL latches in a first group of XDL latches (the X group) and two corresponding SA latches,
  two XDL latches in a second group of XDL latches (the Y group) and two corresponding SA latches, and
  two XDL latches in a third group of XDL latches (the Z group) and two corresponding SA latches.

Control circuitry 310 uses 8 control lines due to each stack of 16 XDL latches being able to transfer 2 bits at a time for each transfer cycle. As such, assertion of a given control line causes 2 bits to be transferred to or from each XDL stack. However, since the control lines are connected to SA latches, and the number of SA latches in each group is not a multiple of the number of control lines, the routing of control lines to SA latches is not straightforward. Instead, at least a portion of the SA tiers are double routed, meaning two control lines are disposed throughout those tiers, rather than one control line per tier.

Figure 11B:
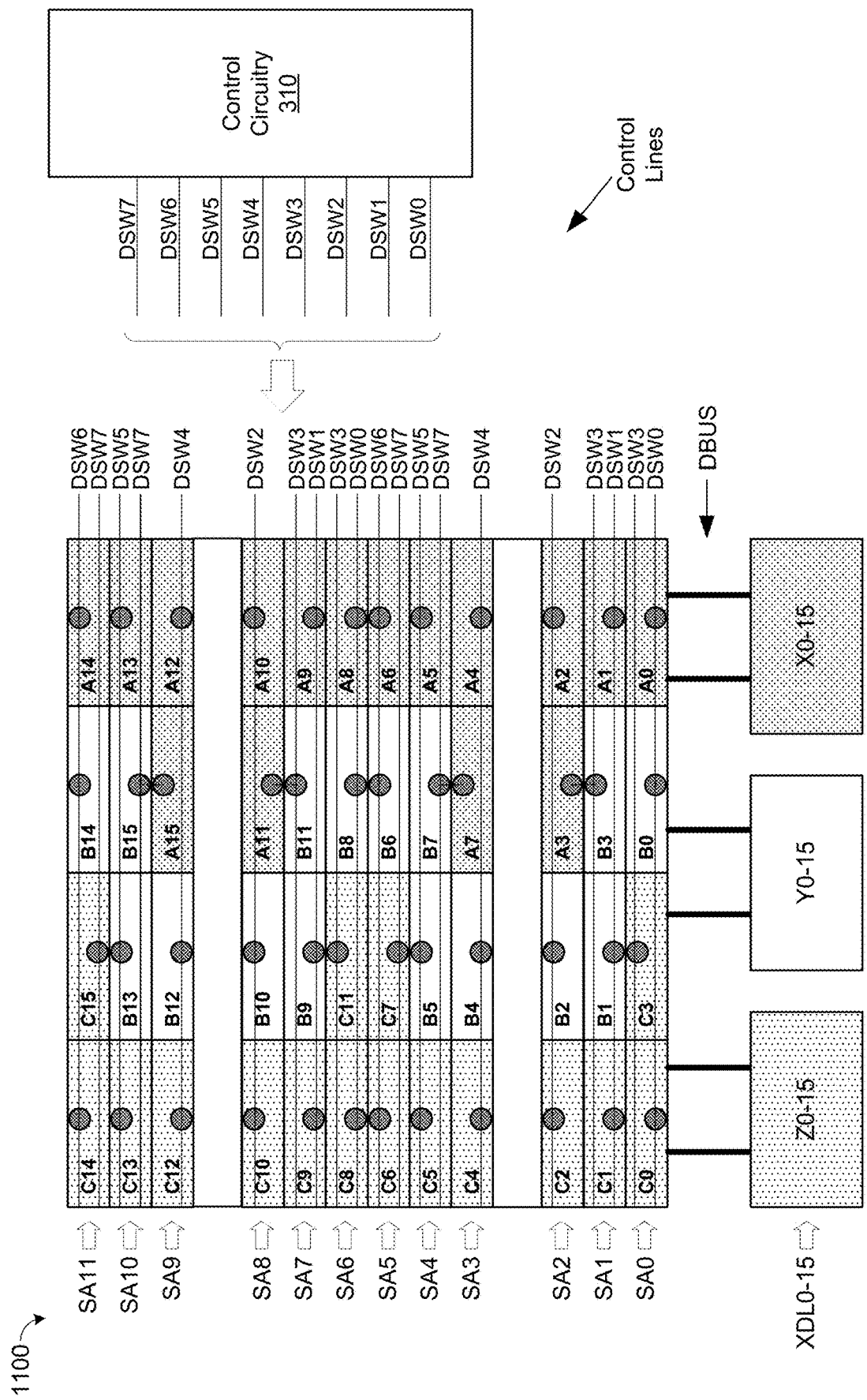
FIG. 11B is a block diagram of a 12-tier sense amplifier and 16-tier data latch structure with control connections in accordance with some implementations In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals are used to denote like features throughout the specification and figures.

FIG. 11B is a block diagram of the 12-tier sense amplifier and 16-tier data latch structure 1000 depicted in FIG. 11A, with control connections in accordance with some implementations. The routing lines connecting the SA tiers to the XDL latches are not shown in this figure, so as not to obscure the control lines. However, such routing lines are still implemented as shown in FIG. 10A. Each control line DSW0-7 is routed to a plurality of SA tiers. As a result, the assertion of a given control line causes the bits in at least two corresponding tiers for one or more of the SA latches in those tiers to be transferred to corresponding XDL latches.

More specifically, each control line (e.g., DSW0) is routed to at least a first SA tier (e.g., SA0) and a second SA tier (e.g., SA6). Some control lines (e.g., DSW3 and DSW7) are routed to six SA tiers. The portion of the particular control line routed to the first SA tier is connected to a subset less than all of the SA latches in that tier (e.g., C0, B0, and A0), and the portion of the control line routed to the second SA tier is connected to a subset less than all of the SA latches in that tier (e.g., C8, B8, and A8). During operation, assertion of the particular control line causes the 6 SA latches (e.g., A0, B0, C0, A8, B8, and C8) to be routed to corresponding data latches (e.g., X0, Y0, Z0, X8, Y8, and Z8 as shown in FIG. 8B).

Implementing the control line routing scheme described above, each control line causes data in 6 SA latches to be transferred as follows:

control line DSW0 transfers data in a subset of three latches in tier SA0, and a subset of three latches in tier SA6;
control line DSW1 transfers data in a subset of three latches in tier SA1 and a subset of three latches in tier SA7;
control line DSW2 transfers data in a subset of three latches in tier SA2, and a subset of three latches in tier SA8;
control line DSW3 transfers data in a single latch from each of tiers SA0, SA1, SA2, SA6, SA7, and SA8;
control line DSW4 transfers data in a subset of three latches in tier SA3, and a subset of three latches in tier SA9;
control line DSW5 transfers data in a subset of three latches in tier SA4, and a subset of three latches in tier SA10;
control line DSW6 transfers data in a subset of three latches in tier SA5, and a subset of three latches in tier SA11; and
control line DSW7 transfers data in a single latch from each of tiers SA3, SA4, SA5, SA9, SA10, and SA11.

From the perspective of the SA latches, each SA tier (SA0-11) is selectively connected to a first control line for transferring data in three of the four latches of the SA tier, and a second control line for transferring data in the other one of the four latches of the SA tier.

As a result of the control line routing scheme described above, a 12-tier SA stack may be controlled using 8 control lines to transfer data between (i) 4 groups of 12 tiers of SA latches, and (ii) 3 groups of 16 tiers of XDL latches. While the above discussion describes 12-tier SA stacks and 16-tier XDL stacks, the mapping (FIG. 9B) and control routing (FIG. 11B) concepts may be applied to other unequal tier combinations of SA stacks and XDL stacks in peripheral circuitry 524. As a result of such mapping and control routing concepts, the peripheral circuitry 524 may be implemented using less x-y area, thereby optimizing chip size.

It will be appreciated by those skilled in the art that changes could be made to the exemplary implementations shown and described above without departing from the broad inventive concept thereof. It is understood, therefore, that this invention is not limited to the exemplary implementations shown and described, but it is intended to cover modifications within the spirit and scope of the present invention as defined by the claims. For example, specific features of the exemplary implementations may or may not be part of the claimed invention, different components as opposed to those specifically mentioned may perform at least some of the features described herein, and features of the disclosed implementations may be combined. As used herein, the terms "about" and "approximately" may refer to + or −10% of the value referenced. For example, "about 9" is understood to encompass 8.2 and 9.9.

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

It will be understood that, although the terms "first," "second," etc. are sometimes used herein to describe various elements, these elements should not be limited by these terms. These terms are only used to distinguish one element from another. For example, a first element could be termed a second element, and, similarly, a second element could be termed a first element, without changing the meaning of the description, so long as all occurrences of the "first element" are renamed consistently and all occurrences of the second element are renamed consistently. The first element and the second element are both elements, but they are not the same element.

As used herein, the term "if" may be, optionally, construed to mean "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, operations, elements, and/or components, but do not preclude the presence or addition of one or more other features, integers, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

Further, to the extent that the method does not rely on the particular order of steps set forth herein, the particular order of the steps should not be construed as limitation on the claims. The claims directed to the method of the present invention should not be limited to the performance of their steps in the order written, and one skilled in the art can readily appreciate that the steps may be varied and still remain within the spirit and scope of the present invention.

What is claimed is:

1. A data storage system, comprising:
   a memory array including a plurality of memory cells; and
   peripheral circuitry disposed underneath the memory array, the peripheral circuitry including:
      an M-tier sense amplifier (SA) circuit including X stacks of SA latches, wherein each SA latch is respectively coupled to a bit line of a memory cell of the plurality of memory cells; and
      an N-tier memory cache data (XDL) circuit including Y stacks of XDL latches, wherein M is less than N, and X is greater than Y; and
      data path circuitry coupling (i) each SA latch of the X stacks of SA latches to (ii) a respective XDL latch of the Y stacks of XDL latches.

2. The data storage system of claim 1, wherein:
   the data path circuitry includes a plurality of bus lines;
   each bus line of the plurality of bus lines couples P SA latches to P XDL latches, wherein P is greater than or equal to 2;
   a first bus line of the plurality of bus lines includes a bridge connection between (i) an SA latch of a first stack of the X stacks, and (ii) an SA latch of a second stack of the X stacks; and
   the first bus line couples the SA latch of the first stack of the X latches and the SA latch of the second stack of the X latches to two XDL latches of a first stack of the Y stacks of XDL latches.

3. The data storage system of claim 1, wherein:
   the peripheral circuitry further comprises data transfer control circuitry including a plurality of control signals; and
   each of the plurality of control signals is coupled to (i) each SA latch of a first of the M tiers of the SA circuit, and (ii) a subset, less than all, of SA latches of a second of the M tiers of the SA circuit.

4. The data storage system of claim 3, wherein:
   the first of the M tiers of the SA circuit is included in a first subset of SA tiers;
   the second of the M tiers of the SA circuit is included in a second subset of SA tiers;
   each SA tier of the first subset of SA tiers is connected to one control signal of the plurality of control signals; and
   each SA tier of the second subset of SA tiers is connected to two control signals of the plurality of control signals.

5. The data storage system of claim 3, wherein:
   each of the plurality of control signals is configured to cause data to transfer between (i) SA latches coupled to a respective control signal, and (ii) corresponding XDL latches of the XDL circuit.

6. The data storage system of claim 1, wherein:
   XDL latches in a first of the Y stacks are coupled to SA latches in a first and a second of the X stacks;
   XDL latches in a second of the Y stacks are coupled to SA latches in the second and a third of the X stacks; and
   XDL latches in a third of the Y stacks are coupled to SA latches in the third and a fourth of the X stacks.

7. The data storage system of claim 1, wherein:
   SA latches in a first of the X stacks are coupled to XDL latches in a first of the Y stacks;
   SA latches in a second of the X stacks are coupled to XDL latches in the first and a second of the Y stacks;
   SA latches in a third of the X stacks are coupled to XDL latches the second and a third of the Y stacks; and
   SA latches in a fourth of the X stacks are coupled to XDL latches in the third of the Y stacks.

8. The data storage system of claim 1, wherein:
   M is equal to 12;
   N is equal to 16;
   X is equal to 4; and
   Y is equal to 3.

9. The data storage system of claim 1, wherein the data path circuitry is configured to transfer all data stored in each SA latch of the X stacks to corresponding XDL latches of the Y stacks in N/2 data transfer cycles.

10. The data storage system of claim 1, further comprising:
    a storage controller coupled to the peripheral circuitry via a storage medium interface;
    wherein the peripheral circuitry is configured to transfer data stored in the Y stacks of XDL latches to the storage controller via the storage medium interface during a read operation.

* * * * *